(12) United States Patent
Qiu et al.

(10) Patent No.: US 10,666,227 B2
(45) Date of Patent: May 26, 2020

(54) TUNABLE SURFACE ACOUSTIC WAVE RESONATORS AND SAW FILTERS WITH DIGITAL TO ANALOG CONVERTERS

(71) Applicants: Cindy X. Qiu, Brossard (CA); Ishiang Shih, Brossard (CA); Chunong Qiu, Brossard (CA); Julia Qiu, Brossard (CA); Andy Shih, Brossard (CA); Yi-Chi Shih, Los Angeles, CA (US)

(72) Inventors: Cindy X. Qiu, Brossard (CA); Ishiang Shih, Brossard (CA); Chunong Qiu, Brossard (CA); Julia Qiu, Brossard (CA); Andy Shih, Brossard (CA); Yi-Chi Shih, Los Angeles, CA (US)

(*) Notice: Subject to any disclaimer, the term of this patent is extended or adjusted under 35 U.S.C. 154(b) by 133 days.

(21) Appl. No.: 15/998,270

(22) Filed: Jul. 27, 2018

(65) Prior Publication Data
US 2020/0036364 A1    Jan. 30, 2020

(51) Int. Cl.
| | |
|---|---|
| *H03H 9/64* | (2006.01) |
| *H03H 9/02* | (2006.01) |
| *H03H 9/145* | (2006.01) |
| *H03H 9/25* | (2006.01) |
| *H01L 41/107* | (2006.01) |
| *H03M 1/66* | (2006.01) |

(52) U.S. Cl.
CPC ......... *H03H 9/6406* (2013.01); *H01L 41/107* (2013.01); *H03H 9/02574* (2013.01); *H03H 9/02614* (2013.01); *H03H 9/02976* (2013.01); *H03H 9/14502* (2013.01); *H03H 9/14538* (2013.01); *H03H 9/25* (2013.01); *H03M 1/66* (2013.01)

(58) Field of Classification Search
CPC ............. H03H 9/6406; H03H 9/02574; H03H 9/02614; H03H 9/02976; H03H 9/14502; H03H 9/14538; H03H 9/25; H01L 41/107; H03M 1/66
USPC ........................................................ 333/193
See application file for complete search history.

(56) References Cited

U.S. PATENT DOCUMENTS

2017/0085246 A1*   3/2017   Shih ................... H03H 9/02574

* cited by examiner

*Primary Examiner* — Benny T Lee
*Assistant Examiner* — Hafizur Rahman

(57) ABSTRACT

Due to strong needs to reduce the dimensions and the cost of the RF filters and to reduce the number of filters required in an mobile handsets and wireless system covering numbers of operation bands, tunable RF filters which can cover as many bands or frequency ranges as possible are needed so that the number of filters can be reduced in the mobile handsets and wireless systems. The present invention provides tunable surface acoustic wave (SAW) IDT structures with the resonant frequency of the acoustic wave to be excited and to be transmitted tuned by digital to analog converters (DACs). The DAC converts an input digital signal to an output DC voltage and provide DC bias voltages to the SAW IDTs through integrated thin film biasing resistors. The polarity and the value of the output DC voltage are controlled by the input digital signal to achieve selection and tuning of the resonant frequency of the SAW IDTs.

24 Claims, 8 Drawing Sheets

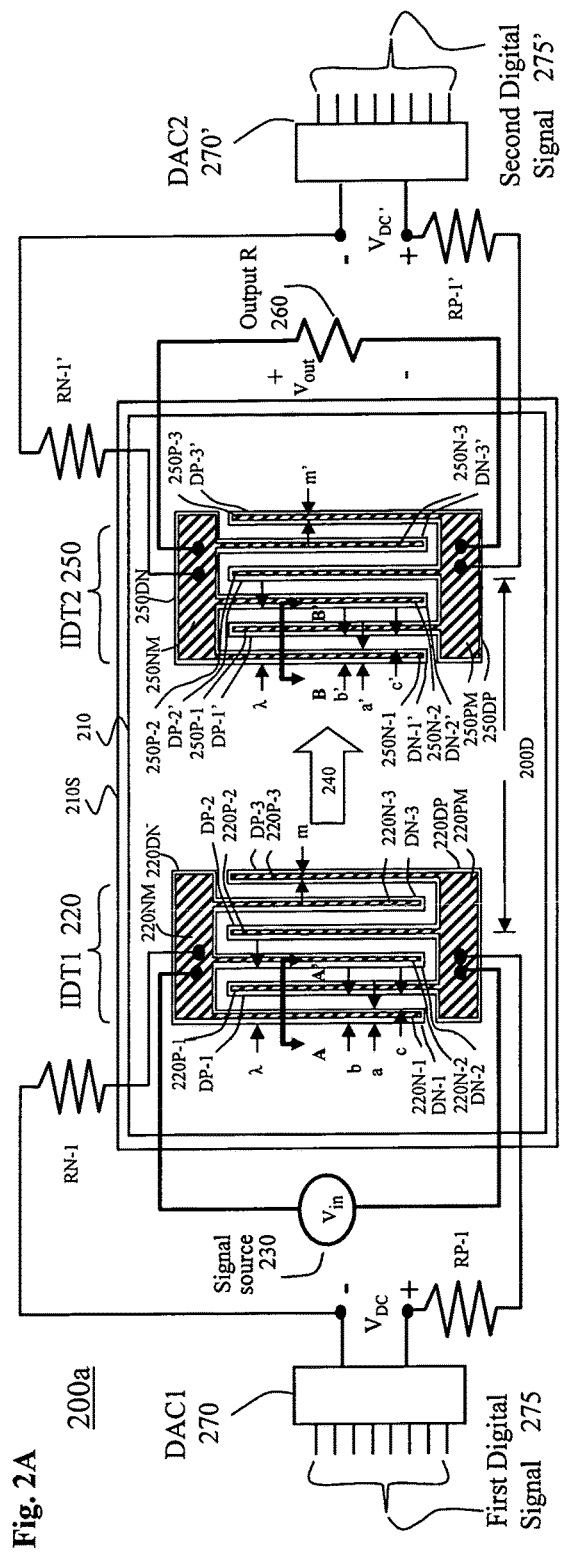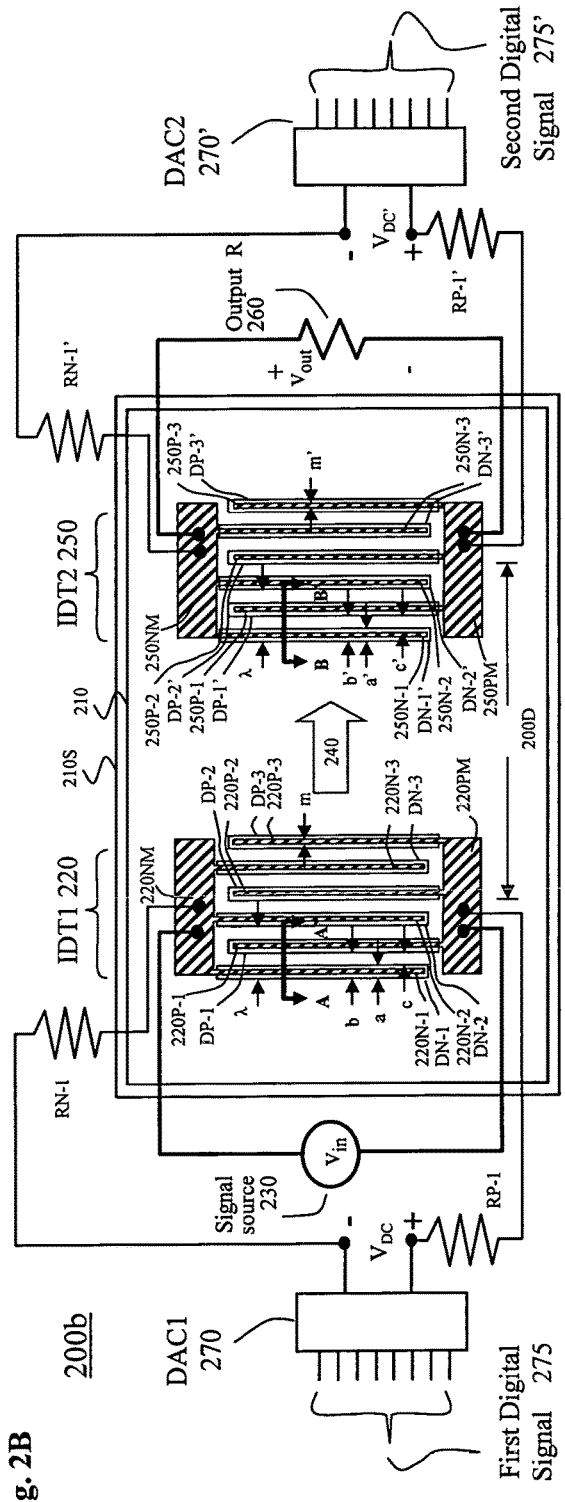
Fig. 2A
Fig. 2B

TUNABLE SURFACE ACOUSTIC WAVE RESONATORS AND SAW FILTERS WITH DIGITAL TO ANALOG CONVERTERS

FIELD OF THE INVENTION

This invention relates to tunable filtering of frequency and generation of frequency of RF signals for communication systems. More specifically, it relates to tunable surface acoustic wave resonators and SAW filters with the frequency of operation regulated by digital to analog converters.

BACKGROUND OF THE INVENTION

Electronic systems especially those for communications applications operated at radio frequencies (RF) require small bandpass filters and oscillators. The oscillators are for generation of RF signals and the bandpass filters are for selection (transmitting or receiving) of signals within certain bandwidth (BW) at a given frequency. Some examples of the systems include global positioning systems (GPS); mobile telecommunication systems consist of: Global Systems for Mobile Communications (GSM), personal communication service (PCS), Universal Mobile Telecommunications System (UMTS), Long Term Evolution Technology (LTE); data transfer units containing: Bluetooth, Wireless Local Area Network (WLAN); satellite broadcasting and future traffic control communications. They also include other high frequency systems for air and space vehicles.

RF bandpass filters are fabricated using different technologies: (a) ceramic filters based on dielectric resonators; (b) filters based on surface acoustic wave resonators (SAW); and (c) filters using thin film bulk acoustic wave resonators (FBAR). Both SAW and FBAR are used when dimensions of the systems are limited. Presently, SAW devices are mainly used in volume applications at frequencies below 2 GHz whereas FBARs are dominant in systems operated at frequencies of 2 to 4 GHz or higher. Due to large volumes, current SAW or FBAR RF filters in handsets are manufactured by microelectronic fabrication processes on wafers using piezoelectric materials such as $LiNbO_3$ (for SAWs) and AlN (for FBARs).

Surface Acoustic Wave (SAW) Filters

The development of SAW devices dated back to 1965, when the first SAW devices were made. Earlier research work in SAW devices was largely to fulfill the needs of radar signal processing. In the 1980s and 1990s, the main development efforts were focused on low loss filters particularly for mobile phones. The basic principles of SAW devices can be understood by considering a basic SAW structure. FIG. 1A shows a schematic diagram of a prior art SAW filter (100) on a piezoelectric substrate (110), with an input inter digital transducer IDT1 (120) with a center-to-center distance between adjacent electrodes controlled to a "pitch" and connected to an electrical signal source (130) to excite acoustic waves (140) with a velocity v and at a frequency $f_o = v/(2 \times pitch)$, an output inter digital transducer IDT2 (150) with a center-to-center distance between adjacent electrodes again also controlled to the "pitch" to receive the acoustic waves (140) and to convert them into an output electrical signal (160). Electrical signals in the signal source (130) at frequencies other than $f_o$ cannot excite resonant acoustic waves in the input IDT1 (120) with sufficient level to reach the output IDT2 (150) and to generate an output in the output terminals. Once a SAW filter is fabricated, the central frequency $f_o$ of transmission and the bandwidth (BW) are fixed by the geometry of the filter and by materials used. The only electrical signals that are allowed to reach the output IDT from the input IDT are those with a frequency within the bandwidth of a center frequency $f_o$.

The main properties of piezoelectric materials for filters are: propagation velocity of acoustic waves, electrode pitch and coupling coefficients, where the velocity of acoustic waves and the electrode pitch determine the resonant frequency and the coupling coefficients affect the bandwidth. Velocities values for several piezoelectric substrates are: $LiNbO_3$ ~4,000 m/s, ZnO ~6,300 m/s, AlN ~10,400 m/s and GaN ~7,900 m/s. As an example, to obtain a filter on $LiNbO_3$ with a central frequency $f_o$ of 2 GHz, the wavelength of the acoustic wave is $\lambda = (4000 \text{ m/sec})/(2 \times 10^9/\text{sec}) = 2 \times 10^{-4}$ cm. Therefore, the value of electrode pitch in FIG. 1 is then equal to $(\frac{1}{2})\lambda$ or 1 µm. Assuming that the width of electrodes and the space between adjacent electrodes are equal, the electrode width is then 0.5 µm.

Film Bulk Acoustic Wave Resonators (FBAR)

The basic element of the film bulk acoustic wave resonator (FBAR) is a thin film resonator which is very similar to the basic quartz crystal scaled down in size. FIG. 1B shows a schematic cross-sectional diagram of a FBAR (200) on a substrate (160) having a substrate thickness (160t), a piezoelectric film (180) of a thickness (180t) is sandwiched between two metal films (170, 190) having a thickness (170t, 190t respectively). An air cavity (165) having an air cavity depth (165t) is present to prevent the acoustic waves from getting into the substrate (160). The equivalent Butterworth/VanDyke circuit model consists of a fixed structure capacitance in parallel with a frequency dependant electromechanical resonant circuit. The key properties of the FBAR are set to store the maximum acoustic energy within the structure and to achieve a high electrical Q. The boundary conditions outside of the metal films must maintain a very high level of acoustic reflection with vacuum being the ideal interface. The materials chosen must optimize both electrical and mechanical properties.

Tunable Filters

For mobile communications, there are about 40 bands. More bands are expected for the next generation long term extension technology. For each communication band, there are two frequencies close to each other: one for transmitting and the other for receiving. Table 1 gives several selected bands for mobile communications used in different regions or countries. In each band, there is a transmit band or Tx Band at a transmit band central frequency $f_{oTR}$ with a transmit bandwidth $BW_{TR}$. There is also an associated receive band or Rx Band at a receive band central frequency $f_{oRE}$ with a receive bandwidth $BW_{RE}$. The separation between the transmit band and the receive band is given by: $f_{oRE} - f_{oTR}$.

TABLE 1

Band frequencies and bandwidth for some of the Bands assigned to mobile handsets and base stations.

| Band | $f_{oTR}$ (MHz) | $BW_{TR}$ (MHz) | $f_{oRE}$ (MHz) | $BW_{RE}$ (MHz) | $f_{oRE}$-$f_{oTR}$ (MHz) | Region |
|---|---|---|---|---|---|---|
| 1 | 1920-1980 | 60 | 2110-2170 | 60 | 190 | Asia, EMEA, Japan |
| 2 | 1850-1910 | 60 | 1930-1990 | 60 | 80 | N. America, Latin Am. |
| 3 | 1710-1785 | 75 | 1805-1880 | 75 | 95 | Asia, EMEA |
| 4 | 1710-1755 | 45 | 2110-2155 | 45 | 400 | N. America, Latin Am. |
| 5 | 824-849 | 25 | 869-894 | 25 | 45 | N. America, Latin Am. |
| 7 | 2500-2570 | 70 | 2620-2690 | 70 | 120 | Asia, EMEA |
| 8 | 880-915 | 35 | 925-960 | 35 | 45 | EMEA, Latin Am. |
| 12 | 699-716 | 17 | 729-746 | 17 | 30 | N. America |

Due to the large number of bands used in mobile handsets, a true world phone needs to cover all 40 bands, each with a transmit band and a receive band. Since each RF filter has only one fixed central frequency of resonant and a fixed bandwidth, therefore, such a true world phone will need to have 80 filters for the front end. Due to resource limitations, some designers design mobile phone handsets to cover 5 to 10 bands for selected regions or countries. Even with this reduced number of bands, the number of RF filters currently required is still large (10 to 20 units). Thus, it would be ideal to develop an RF filter which can cover as many bands or frequency ranges as possible so that the size and power consumption of RF front ends in a mobile handset and microwave systems can be reduced. In Table 1, values of $(f_{oRE}-f_{oTR})/f_{oTR}$ are listed. It is seen that majority has a value of 10% or less: mostly ~5%. Therefore, tunable filters with a tuning range of 10% or more will be highly valuable for communications.

In order to fulfill the demands for RF filters covering as many bands or frequency ranges as possible, tunable SAW inter digital transducers and reflectors have been invented and disclosed in patent applications US2017-0085246 and US2017-0366165 by the inventors of the present application. These inventions provide tunable surface acoustic wave resonators utilizing semiconducting piezoelectric layers having embedded or elevated electrode doped regions. Both metallization ratio and loading mass are changed by varying a DC biasing voltage to effect a change in the resonant frequency. A plurality of the present tunable SAW devices may be connected into a tunable and selectable microwave filter for selecting and adjusting of the bandpass frequency or an tunable oscillator by varying the DC biasing voltages. In US patent applications US2017-0025596 and US2018-0069528, frequency tunable FBAR resonators and filters having at least a doped piezoelectric layer are disclosed. The central frequency of resonant is tuned by applying at least a DC biasing voltage.

Modern electronic systems such as: mobile phones, base stations and phase arrays often involve digital signals for computation, processing and representation of parameters such as frequencies. In an RF system involving a resonant frequency based on a voltage-controlled tunable filter, a voltage with a specific magnitude is required. Therefore, in order to use the voltage-controlled tunable RF filter in association with a modern electron system, there is a need to control the digital signals which represent the required resonant frequency and convert them into a DC voltage. This DC voltage is then applied to the voltage-controlled tunable microwave filter to vary the central frequency of the filter.

BRIEF SUMMARY OF THE INVENTION

One object of the invention is to provide tunable SAW IDTs with embedded negative and positive electrode doped regions of the same conduction type for forming resonators, filters, oscillators and switches wherein the central frequency of the acoustic waves to be excited and to be received are tuned by digital to analog converters (DAC) which provides DC bias voltages to the input IDTs and the output IDTs through integrated thin film bias resistors.

One other object of the invention is to provide tunable SAW IDTs with embedded negative and positive electrode doped regions having different conduction types for forming resonators, filters, oscillators and switches wherein the central frequency of the acoustic waves to be excited and to be received are tuned by digital to analog converters (DAC) which provides DC bias voltages to the input IDTs and the output IDTs through integrated thin film bias resistors.

Another object of the invention is to provide tunable SAW IDTs with elevated negative and positive electrode doped regions of the same conduction type for forming resonators, filters, oscillators and switches wherein the central frequency of the acoustic waves to be excited and to be received are tuned by digital to analog converters (DAC) which provides DC bias voltages to the input IDTs and the output IDTs through integrated thin film bias resistors.

Yet another object of the invention is to provide tunable SAW IDTs with elevated negative and positive electrode doped regions having different conduction types for forming resonators, filters, oscillators and switches wherein the central frequency of the acoustic waves to be excited and to be received are tuned by digital to analog converters (DAC) which provides DC bias voltages to the input IDTs and the output IDTs through integrated thin film bias resistors.

Still another object of the invention is to provide digital to analog converters (DAC) with output DC voltages controlled by input digital signals, for tuning of the central frequency of the surface acoustic wave (SAW) resonator. The tunable SAW resonators can be used to form microwave filters, oscillators and switches, with the central frequency of resonance tunable by the input digital signals applied to the digital to analog converter (DAC), for the construction of wireless or microwave systems.

BRIEF DESCRIPTION OF THE DRAWINGS

FIG. 2A shows a schematic top view of a SAW filter (200a) with tunable central frequency according to one embodiment of the invention.

FIG. 2B is a schematic top view showing a tunable SAW filter (200b) layer (210) according to this invention.

DETAIL DESCRIPTION OF THE INVENTION

Figure 1A:
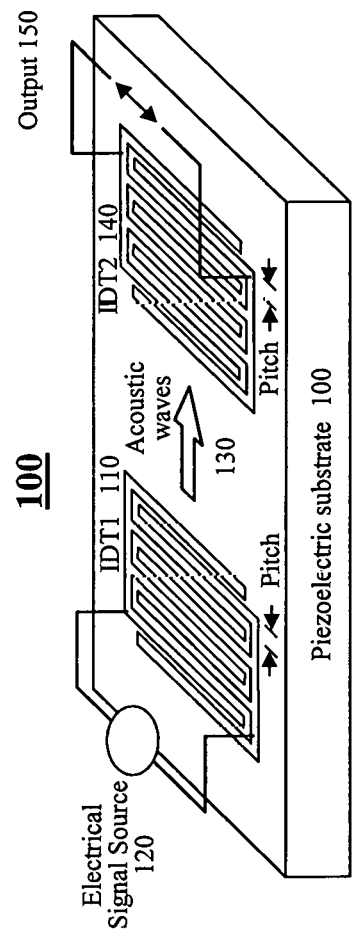
FIG. 1A shows a schematic diagram of a prior art surface acoustic wave filter (100a).
Figure 1B:
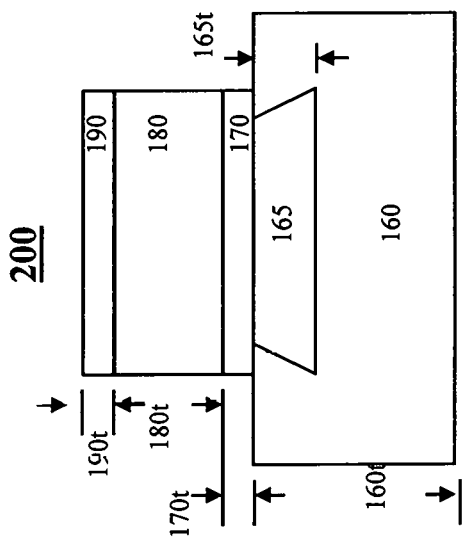
FIG. 1B shows a schematic cross-sectional diagram of a prior art film bulk acoustic resonator FBAR (100b).

Tunable SAW IDTs with Digital to Analog Converters

Tunable surface acoustic waves (SAW) inter digital transducers (IDTs) and reflectors for SAW devices such as SAW filters, oscillators and other devices with integrated thin film resistors for DC biasing and RF isolation are provided according to this invention. The central frequency of resonance of the SAW IDTs are tuned by an DC voltage supplied by digital to analog converters (DACs) with the DC voltage controlled and determined by digital signals applied to the DACs.

FIG. 2A shows a schematic top view of a tunable SAW filter (200a) according the present application. The tunable SAW filter (200a) has an input inter digital transducer IDT1 (220) and an output inter digital transducer IDT2 (250) and it is made on a first piezoelectric layer (210) and a support substrate (210S). In the SAW filter (200a), a first digital to analog converter DAC1 (370) converts a first digital signal (275) to a first input DC biasing voltage $V_{DC}$ which is applied to the input inter digital transducer IDT1 through integrated input thin film bias resistors (RN-1, RP-1) to tune and adjust the frequency of the surface acoustic waves to be excited in IDT1. A second digital to analog converter DAC2 (270') converts a second digital signal (275') to a first output DC biasing voltage $V_{DC'}$ which is applied to the output inter digital transducer IDT2 through integrated output thin film bias resistors (RN-1', RP-1'). The thin film bias resistors (RN-1, RP-1, RN-1' and RP-1') are integrated with the SAW IDTs and are fabricated on the same substrate in the same fabrication process for the IDTs. Although only three pairs of electrode fingers are shown for IDT1 and IDT2 in FIG. 2A, it is understood that in practical SAW devices, the number of electrode fingers is often much larger in order to achieve the required performance.

The IDT1 (220) comprises an input positive electrode pad (220PM) on an input positive electrode pad doped region (220DP); an input negative electrode pad (220NM) on an input negative electrode pad doped region (220DN); input positive electrode fingers (220P-1, 220P-2, 220P-3) each on an input positive electrode doped region (DP-1, DP-2, DP-3); input negative electrode fingers (220N-1, 220N-2, 220N-3) each on an input negative electrode doped region (DN-1, DN-2, DN-3). A center-to-center distance between an input positive electrode finger and an adjacent input negative electrode finger is controlled to an input pitch (given by b). The input electrode fingers are connected to an electrical signal source (230) to excite surface acoustic waves (240) at a frequency f≈v/(2×b), with v being the velocity of the surface acoustic waves.

The output inter digital transducer IDT2 (250) comprises an output positive electrode pad (250PM) on an output positive electrode pad doped region (250DP); an output negative electrode pad (250NM) on an output negative electrode pad doped region (250DN); output positive electrode fingers (250P-1, 250P-2, 250P-3) each on an output positive electrode doped region (DP-1', DP-2', DP-3'); output negative electrode fingers (250N-1, 250N-2, 250N-3) each on an output negative electrode doped region (DN-1', DN-2', DN-3'). A center-to-center distance between an output positive electrode finger and an adjacent output negative electrode finger is controlled to an output pitch (b') which is preferably the same as the input pitch (b), to receive the surface acoustic waves (240) and to convert them into an output electrical signal $V_{out}$ across an output resistor R (260).

The input inter digital transducer (220) and output inter digital transducer (250) are kept apart by an IDT center-to-center distance (200D). The input electrode doped region widths (a) are kept to be substantially equal to half of the input pitch (b) so that a spacing between adjacent input electrode doped regions (c) is also substantially equal to half of the input pitch (b). Similarly, the output electrode doped region width (a'=a) is kept to be substantially equal to half of the output pitch (b'=b) so that a spacing between adjacent output electrode doped regions (c') is also substantially equal to half of the output pitch (b'=b). The input electrode finger width (m) is selected to be the same as the output electrode finger width (m') and the finger widths (m, m') are no more than the electrode doped region widths (a, a').

It is noted that the effects of tuning and adjustment of frequency for the SAW structure (200a) shown in FIG. 2A may well be implemented using another SAW structure. FIG. 2B shows a schematic top view of a tunable and adjustable SAW filter (200b) having an input inter digital transducer IDT1 (220) and an output inter digital transducer IDT2 (250) on a first piezoelectric layer (210). The SAW filter (200b) comprises an input negative electrode pad (220NM), an input positive electrode pad (220PM), an output negative electrode pad (250NM) and an output positive electrode pad (250PM) which are directly deposited on the first piezoelectric layer (210). Other elements and components in FIG. 2B are the same as those in FIG. 2A with the exception of the missing input electrode pad doped regions (220DP, 220DN) and the output electrode pad doped regions (250DP, 250DN).

To operate the SAW filter in FIG. 2A, a first digital signal (275) is applied to DAC1 to generate and control a first input DC biasing voltage $V_{DC}$ so that the resonant frequency of IDT1 is $f_{o1}$, and a second digital signal (275') is applied to DAC2 to generate and control a first output DC biasing voltage $V_{DC'}$ so that the resonant frequency of IDT2 is $f_{o1'}$. Value of the first input DC biasing voltage $V_{DC}$ is preferably to be the same as the first output DC biasing voltage $V_{DC'}$ to achieve synchronous tuning of the frequencies in IDT1 and IDT2, so that $f_{o1}=f_{o1'}$. Here, $V_{DC}$ and $V_{DC'}$ could be positive or negative in polarity but with a small magnitude, as long as they can tune and adjust the frequencies of the IDT1 and IDT2.

Figure 2C:
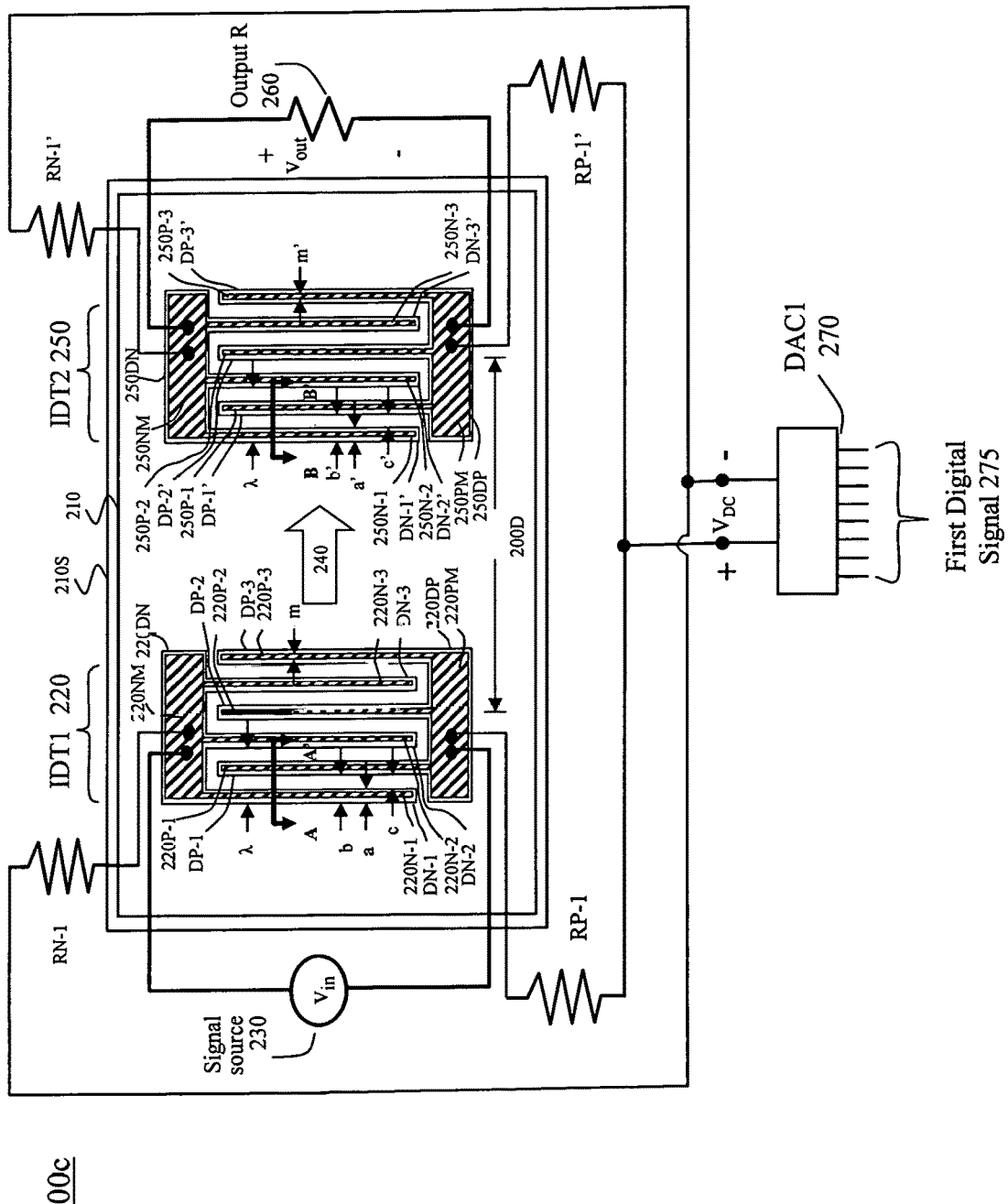
FIG. 2C shows a schematic top view of a SAW filter (200c) with tunable central frequency. Here, a single digital to analog converter is used to provide a DC biasing voltage for both IDT1 and IDT2.

Since value of the $V_{DC}$ is preferably to be same as that of the $V_{DC'}$ to achieve synchronous tuning for the frequencies in IDT1 and IDT2, a single DAC1 can be connected to both IDT1 and IDT2 to effect the frequency tuning. As shown in FIG. 2C, a first digital to analog converter DAC1 (270) converts a first digital signal (275) to a first DC biasing voltage $V_{DC}$ which is connected to both the input IDT1 and the output IDT2. Here, $V_{DC}$ could be positive or negative in polarity but with a small magnitude, as long as they can tune and adjust the frequencies of the IDT1 and IDT2.

The value of pitch (b or b') is selected during the design and fabrication of the SAW device and the wavelength of surface acoustic waves (240) to be excited and to propagate is: $\lambda=2b=2b'$. The value of $\lambda$ together with the velocity v of the surface acoustic waves thus determine a unique central frequency $f=v/\lambda$ of the excitation, propagating and detection of the surface acoustic waves. The tuning of frequency in a tunable SAW IDT is based on the adjustment of mass loading (ML) and adjustment of metallization ratio (MR) associated with the electrode doped regions and electrode fingers. Detail description on the effects of DC bias voltages between the positive electrode doped regions (220P-1, 220P-2, 220P-3) and negative electrode doped regions (220N-1, 220N-2, 220N-3) on mass loading (ML) and metallization ratio (MR) can be found in U.S. Patent Pub. Nos. US2017-0085246 and US2017-0366165.

According to this invention, material of the first piezoelectric layer (210) is selected from a group of piezoelectric semiconductors including: $LiNbO_3$, $LiTaO_3$, ZnO, AlN, GaN, AlGaN, $LiTaO_3$, GaAs, AlGaAs and etc. Take one of the well developed piezoelectric substrates $LiNbO_3$ as an example, the velocity of acoustic waves v is about 4,000 msec. To obtain a filter with a central frequency $f_o=2$ GHz, the wavelength of the acoustic wave is $\lambda=(4000\ m/sec)/(2\times 10^9/sec)=2\times 10^{-4}$ cm. The value of pitch (b or b') is then equal to 1 μm. Assuming that the width of electrode doped regions (a or a') and the space between adjacent electrode doped regions (c or c') are equal, then the electrode doped region width is 0.5 μm. To fabricate SAW IDTs operating at higher frequencies, more advanced lithography tools and more severe processing control will be needed.

The support substrate (210S) are selected from a material group including: $LiNbO_3$, $LiTaO_3$, PZT, AlN, GaN, AlGaN, ZnO, GaAs, AlAs, AlGaAs, $Al_2O_3$, $BaTiO_3$, quartz, $KNbO_3$, Si, sapphire, quartz, glass and plastic. Thickness of the support substrate (210St) is selected by considering mechanical strength, thermal dissipation and acoustic properties requirements. When the material of the first piezoelectric layer (210) is selected to be the same as the support substrate (210S), they can be combined into a single piezoelectric substrate.

The input positive electrode doped regions (DP-1, DP-2, DP-3), the input negative electrode doped regions (DN-1, DN-2, DN-3), the output positive electrode doped regions (DP-1', DP-2', DP-3') and the output negative electrode doped regions (DN-1', DN-2', DN-3') are doped piezoelectric semiconductors, materials of which can be selected from a group including: AlN, GaN, AlGaN, ZnO, GaAs, AlAs, and AlGaAs as long as they are piezoelectric semiconductors with sufficient acoustic coupling coefficients and can be doped into n-type and/or p-type conductions. As materials of the input/output positive doped regions and input/output negative doped regions are selected to be a piezoelectric semiconductor having a substantially large energy gap, unwanted leakage current can be kept small when the DC biasing voltage is applied. According to one embodiment of this invention, the thicknesses of the input positive/negative electrode doped regions and the output positive/negative electrode doped regions are preferably controlled to be in a range of 10 to 2000 nm and are more preferably controlled to be in a range of 20 to 1000 nm, dependent on the operation frequency, the tuning range and the sensitivity of the tuning required.

In FIG. 2A, the input first doping type of the input positive electrode doped regions and the input second doping type of the input negative electrode doped regions are selected to be different. The output first doping type of the output positive electrode doped regions and the output second doping type of the output negative electrode doped regions are also selected to be different. The input first doping type and the input second doping type, the output first doping type and the output second doping type can also be selected to be the same. In such cases, DC biasing arrangements different from FIG. 2A then will be adopted. The input first doping concentration of the input positive electrode doped regions, the input second doping concentration of the input negative electrode doped regions, the output first doping concentration of the output positive electrode doped regions and the output second doping concentration of the output negative electrode doped regions in the tunable SAW inter digital transducers (IDT1, IDT2) are preferably to be controlled in the range of $10^{13}$-$10^{20}$ cm$^{-3}$ dependent on the operation frequency and tuning rage required.

In order to facilitate ohmic contacts between the electrode doped regions and the electrode fingers, it is preferable to have a heavily doped surface layer on the input positive/negative electrode doped regions (DP-1, DP-2, DP-3, DN-1, DN-2, DN-3) and the output positive/negative electrode doped regions (DP-1', DP-2', DP-3', DN-1', DN-2', DN-3'). Thicknesses of the DN$^+$ layer and the DP$^+$ layer should be kept small (preferably in the order of 20 nm or less).

Materials for the input positive electrode fingers (220P-1, 220P-2, 220P-3), the input negative electrode fingers (220N-1, 220N-2, 220N-3), the input positive electrode pad (220PM) and the input negative electrode pad (220NM) are selected from a metal group including: Ti, Al, W, Pt, Mo, Cr, Pd, Ta, Cu, Cr, Au, Ni, Ag, Ru, Ir and other metals and alloys. Materials for the output positive electrode fingers (250P-1, 250P-2, 250P-3), output negative electrode fingers (250N-1, 250N-2, 250N-3), the output positive electrode pad (250PM) and the output negative electrode pad (250NM) are selected from the same group of metals and metal alloys so that they can provide the same electrical performance and can be deposited in the same deposition run.

Materials of the bottom electrode layer (210BM) may be selected from a group of metals and doped semiconductors, preferably doped piezoelectric semiconductors, including: Ti, Al, W, Pt, Mo, Cr, Pd, Ta, Cu, Cr, Au, Ni, Ag, Ru, Ir, MN, GaN, AlGaN, ZnO, GaAs, AlAs, AlGaAs and their combinations.

It is desired to have ohmic contacts between the electrode doped regions and the electrode fingers, therefore material for the first layer of the electrode fingers that contacts the electrode doped regions should be selected with care. Take the IDT1 (220) as an example, when the input positive electrode doped regions are doped to have a p-type conduction, the first layer of the input positive electrode fingers that contact the input positive electrode doped regions should have a work function larger than the electron affinity of the piezoelectric semiconducting material of the input positive electrode doped regions. When the input second doping type is opposite to the input first doping type, the input negative electrode doped regions is doped to an n-type conduction. Therefore, the first layer of the input negative electrode fingers should have a work function close to or less than the electron affinity of the piezoelectric semiconducting material of the input negative electrode doped regions.

According one embodiment of this invention, the input positive/negative electrode finger thickness (220P-1$t$, 220N-1$t$) are preferably selected to be in a range of 10 to 400 nm, depending on the operation frequency and the frequency tuning range required. In order to decrease the mass loading effect of the input positive/negative electrode fingers and output positive/negative electrode fingers and to increase sensitivities of the frequency tuning, it is preferred to select metals with smaller atomic weights such as Al, Ti as a part of the input electrode fingers and the output electrode fingers. It is also preferable to have a reduced input/output electrode finger thickness (in a range of 20 to 200 nm). Furthermore, a multilayer metal structure involving at least two metal materials may be advantageously adopted to improve the adhesion of the input positive/negative electrode fingers and the output positive/negative electrode fingers and to reduce the contact resistance.

To effectively isolate RF signals and allow application of DC biasing voltages, the resistance values of the integrated input and output thin film bias resistors (RN-1, RP-1, RN-1' and RP-1') are preferably greater than 200 S, and are more preferably greater than 1000Ω. However, the resistance value R should not be too large in order to keep the RC constant low and to reduce any unwanted switching delay time ($\tau_1 = R_1 \times C$) of the SAW device. The integrated input and output thin film bias resistors may have different shapes such as rectangle, square, triangle, trapezium, parallelogram etc. Take rectangle shape as an example: the integrated input and output thin film bias resistors may have a bias resistor length $R_L$, a bias resistor width $R_W$, a bias resistor thickness $R_T$. The bias resistor thickness $R_T$ is preferably less than 2 micron and is more preferably less than 0.5 micron to facilitate patterning either by etching or by lift-off.

Materials of the integrated thin film bias resistors (RN-1, RP-1, RN-1' and RP-1') may be metals such as Ni, Cr, Ta, W, Mo and their alloys including NiCr. They may also be metal oxides, metal nitrides and metal oxynitrides such as $RuO_2$, TaN, ZnO, ZnON, InSnO, InSnON, ZnInO, ZnInON, ZnSnO, ZnSnON, $Bi_2Ru_2O_7$, $RuO_2$, $Bi_2Ir_2O_7$, and other semiconductors such as Si as long as the resistance of the integrated thin film bias resistors is preferably greater than 200Ω (or more preferably greater than 1000Ω) and has stable thermal properties. The thin film layers forming the thin film bias resistors may be deposited by vacuum methods such as evaporation, DC sputtering and RF sputtering in a chamber with Ar gas or with a gas mixture of Ar, $O_2$ and/or $N_2$.

Figure 3A:
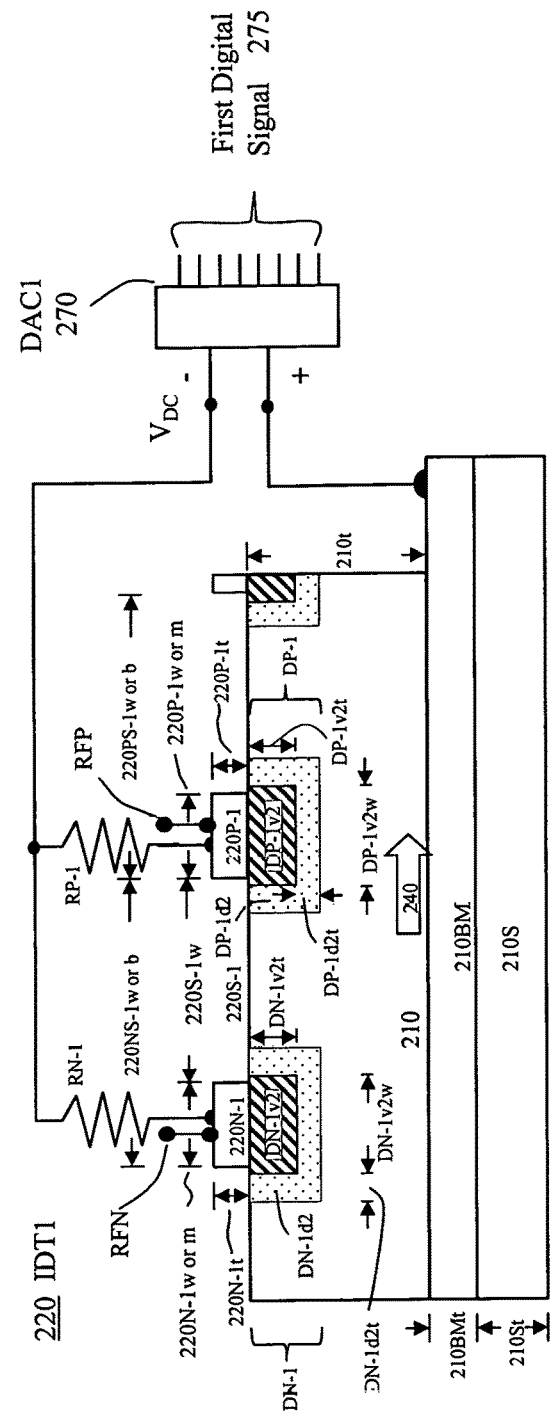
FIG. 3A is a schematic cross-sectional view taken along line A-A' in the tunable SAW filter (200a), showing a part of the IDT1 with embedded input positive and negative electrode doped neutral regions of the same doping type.
Figure 3B:
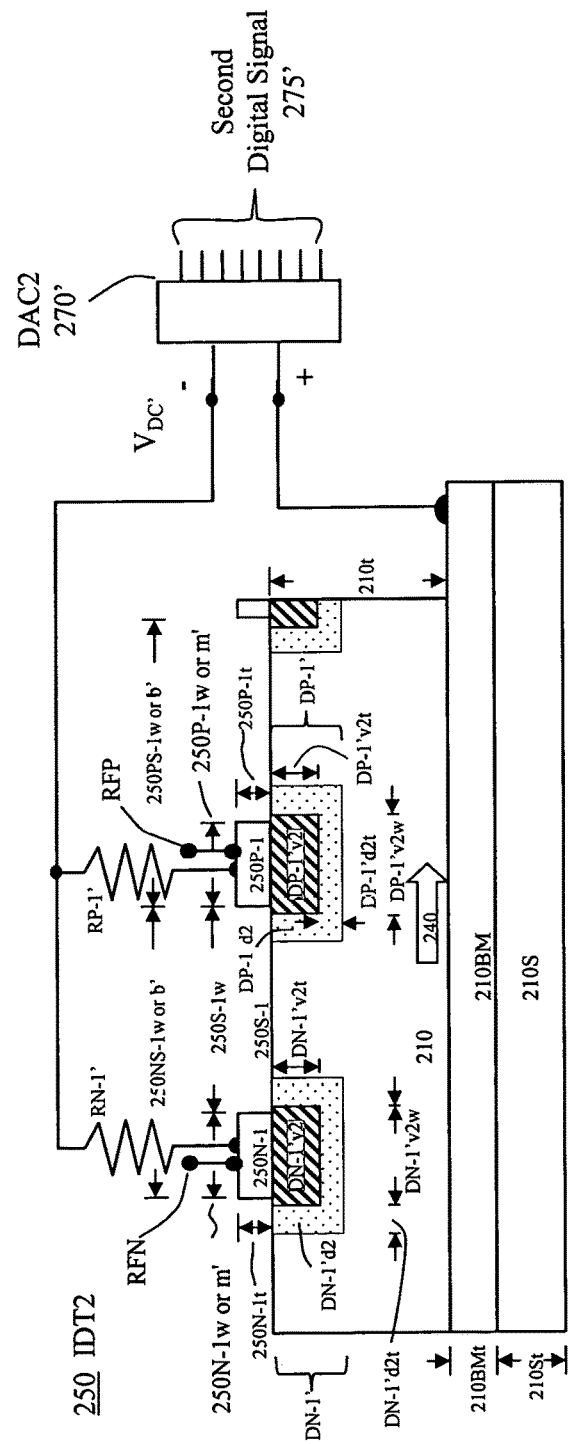
FIG. 3B is a schematic cross-sectional view taken along line B-B' in the tunable SAW filter (200a, FIG. 2A), showing a part of the IDT2 with embedded output positive and negative electrode doped neutral regions of the same doping type.

IDTs with Embedded Electrode Doped Regions of the Same Doping Type:

Schematic cross sectional views of the IDT1 (220) and the IDT2 (250), taken along lines A-A' and B-B' respectively in the SAW structure (200$a$) in FIG. 2A, are shown in FIGS. 3A and 3B for IDT1 (220) and IDT2 (250) with embedded input/output positive/negative electrode doped regions and with opposite doping types for the positive electrode doped regions and the negative electrode doped regions.

FIG. 3A is a schematic cross-sectional view of a part of IDT1 (220) in a tunable and adjustable SAW filter similar to the IDT1 shown in FIG. 2A, showing two adjacent input electrode fingers (220N-1, 220P-1) on embedded input electrode doped neutral regions (DN-1$v$2, DP-1$v$2). A bottom electrode layer (210BM) of a bottom electrode layer thickness (210BMt) is sandwiched between the support substrate (210S) and the first piezoelectric layer (210). The input positive electrode doped region (DP-1) contains two parts: an input positive electrode doped neutral region (DP-1$v$2) and an input positive electrode depletion region (DP-1$d$2). The input negative electrode doped region (DN-1) also has two parts: an input negative electrode doped neutral region (DN-1$v$2) and an input negative electrode depletion region (DN-1$d$2). The input positive electrode doped neutral region (DP-1$v$2) has an input positive electrode doped neutral region thickness (DP-1$v$2$t$) and an input positive electrode doped neutral region width (DP-1$v$2$w$) and the input negative electrode doped neutral region (DN-1$v$2) has an input negative electrode doped neutral region thickness (DN-1$v$2$t$) and an input negative electrode doped neutral region width (DN-1$v$2$w$). The input positive electrode depletion region (DP-1$d$2) has an input positive electrode depletion region thickness (DP-1$d$2$t$) and the input negative electrode depletion region (DN-1$d$2) has an input negative electrode depletion region thickness (DN-1$d$2$t$).

Although the input first doping type of the input positive electrode doped neutral region (DP-1$v$2) and the input second doping type of the input negative electrode doped neutral region (DN-1$v$2) can be different, the input first doping type and the input second doping type in FIG. 3A are selected to be the same (either p-type or n-type). The first doping concentration of the input positive electrode doped neutral region (DP-1$v$2) and the second doping concentration of the input negative electrode doped region (DN-1$v$2) are selected to be substantially the same and are preferably to be in the range of $10^{13}$-$10^{20}$ $cm^{-3}$, dependent on the operation frequency and tuning range required. The input positive electrode finger (220P-1) with an input positive electrode finger thickness (220P-1$t$) makes an ohmic contact to the input positive electrode doped neutral region (DP-1$v$2) and the input negative electrode finger (220N-1) with an input negative electrode finger thickness (220N-1$t$) makes an ohmic contact to the input negative electrode doped neutral region (DN-1$v$2). In order to facilitate ohmic contacts, it is preferable to have a heavily doped surface layer on the embedded input positive/negative electrode doped regions. Thicknesses of the heavily doped surface layers should be kept small (in the order of 20 nm or less).

The space between the input positive electrode finger (220P-1) and the input negative electrode finger (220N-1) defines an input electrode spacing region (220S-1) with an input electrode spacing region width (220S-1$w$). The pitch (220NS-1$w$ or $b$) is equal to the sum of the input positive/negative electrode finger width (m) and the input electrode spacing region width (220S-1w) and it is also equal to (220PS-1w). RF signals are applied through a positive RF contact (RFP) and a negative RF contact (RFN). The integrated input thin film bias resistors (RP-1, RN-1) isolate the RF signals from the DC bias circuit.

A first digital to analog converter DAC1 (270) converts a first digital signal (275) to a first input DC biasing voltage $V_{DC}$. As a result of the same doping type of the input positive and negative electrode doped neutral regions, the input electrode fingers (220P-1) and (220N-1) are connected together through integrated input thin film bias resistors (RP-1, RN-1) to a negative output terminal of the first digital to analog converter DAC1 (270), whereas the bottom electrode layer (210BM) of a thickness (210BMt) is connected to a positive output terminal of the first digital to analog converter DAC1 (270), so that the first input DC biasing voltage $V_{DC}$ is applied between the input electrode fingers (220P-1, 220N-1) and the bottom electrode layer (210BM). Although the doping types and the biasing arrangement for IDT1 in FIG. 3A are different from the IDT1 shown in FIG. 2A, the elements in FIG. 3A are marked the same as these in the IDT1 in FIG. 2A for convenience.

In FIG. 3A, the first input DC biasing voltage $V_{DC}$ could be positive or negative in polarity. The value and the polarity of $V_{DC}$ is regulated and adjusted by the first digital signal (275) supplied to the first digital to analog converter DAC1 (270), to achieve control and adjustment for the thickness (DP-1$d2t$, DN-1$d2t$) of the input positive/negative electrode depletion regions (DP-1$d2$, DN-1$d2$), the thickness and width (DP-1$v2t$, DP-1$v2w$, DN-1$v2t$, DN-1$v2w$) of the input positive/negative electrode doped neutral regions (DP-1$v2$, DN-1$v2$). This in turn regulates and changes the input positive electrode loading mass (the sum of mass of (DP-1$v2$) and mass of (220P-1)) and the input negative electrode loading mass (the sum of mass of (DN-1$v2$) and mass of (220N-1)) in IDT1 to achieve a mass loading frequency difference $\Delta f_{ML}$ (from the basic frequency value $f_o$) for the surface acoustic waves (240) to be excited. It also adjusts and changes the metallization ratio associate with the input positive electrode doped neutral region and the input negative electrode doped neutral region to achieve a metallization ratio frequency difference $\Delta f_{MR}$.

When the input positive/negative electrode depletion region thicknesses (DP-1$d2t$, DN-1$d2t$) are increased by an increase in the magnitude of the first input DC biasing voltage $V_{DC}$, the frequency of the surface acoustic waves will increase due to a decrease in the loading mass ML of the input positive/negative electrodes and a decrease in the metallization ratios MR. When the input positive/negative electrode depletion region thickness (DP-1$d2t$, DN-1$d2t$) are decreased by a decrease in the magnitude of the first input DC biasing voltage $V_{DC}$ or by reversing the polarity of $V_{DC}$, the frequency of surface acoustic waves will decrease due to an increase in the loading masses ML of the input positive/negative electrode (as a result of increases in the thicknesses and widths of the input negative and positive electrode doped neutral regions) and an increase in the metallization ratios MR (as a result of increases in widths of the input negative and positive electrode doped neutral regions). The mass loading frequency difference $\Delta f_{ML}$ combined with the metallization ratio frequency difference $\Delta f_{MR}$ will produce an overall frequency difference $\Delta f_T$ from the basic frequency value $f_o$.

FIG. 3B shows a schematic cross-sectional view of a part of IDT2 (250) in a tunable and adjustable SAW filter such as (200a), showing two adjacent output electrode fingers (250N-1, 250P-1) on embedded electrode doped neutral regions (DN-1'$v2$, DP-1'$v2$). A bottom electrode layer (210BM) having a bottom electrode layer thickness (210BMt) is sandwiched between the support substrate (210S) and the first piezoelectric layer (210). In FIG. 3B, the output positive electrode doped region (DP-1') contains two parts: an output positive electrode doped neutral region (DP-1'$v2$) and an output positive electrode depletion region (DP-1'$d2$). The output negative electrode doped region (DN-1') also contains two parts: an output negative electrode doped neutral region (DN-1'$v2$) and an output negative electrode depletion region (DN-1'$d2$). The output positive electrode doped neutral region (DP-1'$v2$) has an output positive electrode doped neutral region thickness (DP-1'$v2t$) and an output positive electrode doped neutral region width (DP-1'$v2w$) and the output negative electrode doped neutral region (DN-1'$v2$) has an output negative electrode doped neutral region thickness (DN-1'$v2t$) and an output negative electrode doped neutral region width (DN-1'$v2w$). The output positive electrode depletion region (DP-1'$d2$) has an output positive electrode depletion region thickness (DP-1'$d2t$) and the output negative electrode depletion region (DN-1'$d2$) has an output negative electrode depletion region thickness (DN-1'$d2t$).

In this structure, the output first doping type of the positive electrode doped neutral region (DP-1'$v2$) and the output second doping type of the negative electrode doped neutral region (DN-1'$v2$) are selected to be the same (either p-type or n-type). The first doping concentration of the positive electrode doped neutral region (DP-1'$v2$) and the second doping concentration of the negative electrode doped neutral region (DN-1'$v2$) are selected to be substantially the same and are preferably to be in the range of $10^{13}$-$10^{20}$ cm$^{-3}$ dependent on the operation frequency and tuning rage required. The output positive electrode finger (250P-1) makes an ohmic contact to the output positive electrode doped neutral region (DP-1'$v2$) and the output negative electrode finger (250N-1) makes an ohmic contact to the output negative electrode doped neutral region (DN-1'$v2$). In order to facilitate ohmic contacts, it is preferable to have a heavily doped surface layer on the embedded output positive/negative electrode doped regions (DP-1', DN-1'). Thicknesses of the heavily doped surface layers should be kept small (in the order of 20 nm or less).

The space between the output positive electrode finger (250P-1) and the output negative electrode finger (250N-1) defines an output electrode spacing region (250S-1) with an output electrode spacing region width (250S-1w). The pitch (250NS-1w or b') is equal to the sum of the output positive/negative electrode finger width (m') and the output electrode spacing region width (250S-1w) and it is also equal to (250PS-1w).

Due to the same doping type of the output positive and negative electrode doped neutral regions (DP-1'$v2$, DN-1'$v2$), the output electrode fingers (250P-1) and (250N-1) are connected together through integrated output thin film bias resistors (RP-1', RN-1') to a negative output terminal of the second digital to analog converter DAC2 (270'), whereas the bottom electrode layer (210BM) of a thickness (210BMt) is connected to a positive output terminal of the DAC2 (270'), so that a first output DC biasing voltage $V_{DC'}$ is applied between the output electrode fingers (250P-1, 250N-1) and the bottom electrode layer (210BM). RF signals are received between a positive RF contact (RFP) and a negative RF contact (RFN). Although the doping types and the biasing arrangement for IDT2 in FIG. 3B are different from IDT2 (250) shown in FIG. 2A, the elements in FIG. 3B are marked the same way as the IDT2 in FIG. 2A for convenience. The integrated output thin film bias resistors (RP-1', RN-1') isolate RF signals from the DC bias circuit.

In FIG. 3B, the DAC2 provides and adjust a first output DC voltage $V_{DC'}$ which could be positive or negative in polarity. The value and the polarity of the $V_{DC'}$ is regulated and adjusted by the second digital signal (275') supplied to the second digital to analog converter DAC2 (270') in order to achieve control and adjustment for the thickness (DP-1'd2t, DN-1'd2t) of the output positive/negative electrode depletion regions (DP-1'd2, DN-1'd2) and the thickness and width (DP-1'v2t, DP-1'v2w, DN-1'v2t, DN-1'v2w) of the output positive/negative electrode doped neutral regions (DP-1'v2, DN-1'v2). This in turn regulates and changes the output positive electrode loading mass (the sum of mass of (DP-1'v2) and mass of (250P-1)) and the output negative electrode loading mass (the sum of mass of (DN-1'v2) and mass of (250N-1)) in IDT2 to achieve a mass loading frequency difference $\Delta f_{ML}$ (from the basic frequency value $f_o$) for the surface acoustic waves (240) to be received. It also adjusts and changes the metallization ratio associate with the output positive electrode doped neutral region and the output negative electrode doped region to achieve a metallization ration frequency difference $\Delta f_{MR}$.

When the output positive/negative electrode depletion region thicknesses (DP-1'd2t, DN-1'd2t) are increased by an increase in the magnitude of the output DC biasing voltage $V_{DC'}$ provided by the DAC2, the frequency of the surface acoustic waves will increase due to a decreases in loading mass of the output positive/negative electrodes and a decrease in the metallization ratios. When the output positive/negative electrode depletion region thickness (DP-1'd2t, DN-1'd2t) are decreased by a decrease in the magnitude of the output DC biasing voltage $V_{DC'}$, or by reversing the polarity of $V_{DC'}$, the frequency of surface acoustic waves will decrease due to the increase in the output positive/negative electrode loading masses (as a result of increases in the thicknesses and widths of the output positive/negative electrode doped neutral regions) and the increase in the metallization ratios MR (as a result of increases in the widths of the output positive/negative electrode doped neutral regions). The mass loading frequency difference $\Delta f_{ML}$ combined with the metallization ratio frequency difference $\Delta f_{MR}$ will produce the overall frequency difference $\Delta f_T$ from the basic frequency $f_o$.

In FIGS. 3A and 3B, the first digital to analog converter DAC1 (270) and the second digital to analog converter DAC2 (270') can be replaced with a single digital to analog converter, which converts digital signals into a DC biasing voltage $V_{DC}$ to achieve frequency tuning in both IDT1 and IDT2.

Figure 3C:
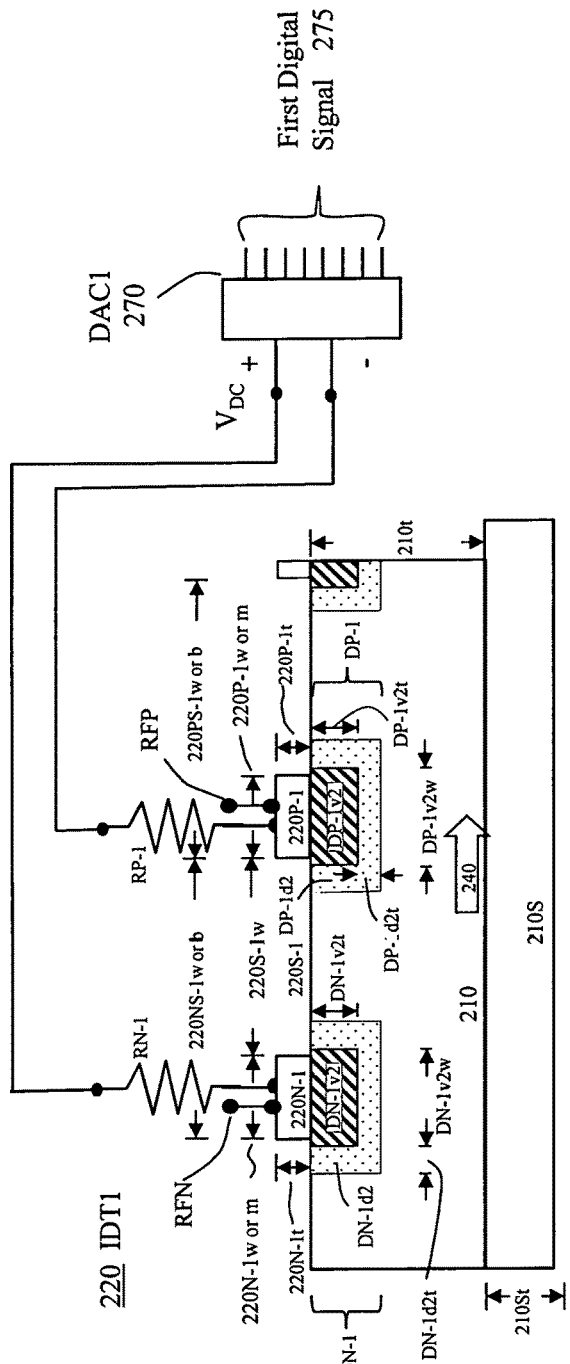
FIG. 3C is a schematic cross-sectional view taken along line A-A' in the tunable SAW filter (200a, FIG. 2A), showing a part of the IDT1 with embedded input positive and negative electrode doped neutral regions having different doping types.
Figure 3D:
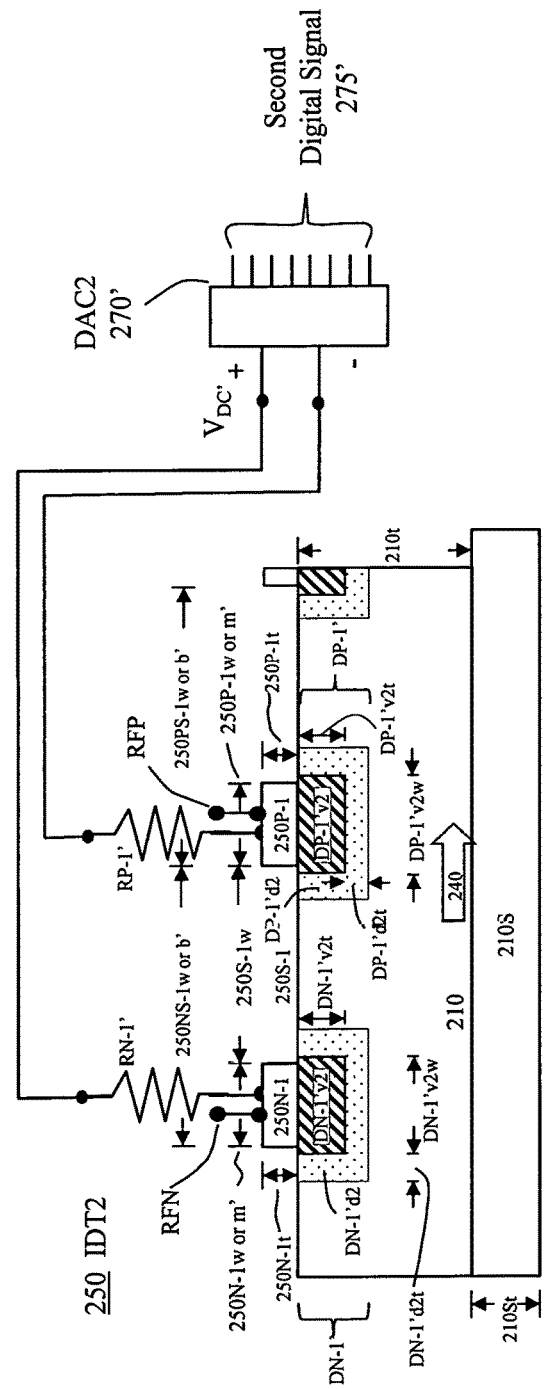
FIG. 3D is a schematic cross-sectional view taken along line B-B' in the tunable SAW filter (200a), showing a part of the IDT2 with embedded output positive and negative electrode doped neutral regions having different doping types.

IDTs with Embedded Electrode Doped Regions of Opposite Doping Types:

FIGS. 3C and 3D show a part of the IDT1 (220) and a part of the IDT2 (250) with embedded input electrode doped regions, taken along the line A-A' and line B-B' in (200a, FIG. 2A) respectively. In the IDT1 (220), all elements are the same as the IDT1 shown in FIG. 3A, except the input first doping type of the input positive electrode doped neutral region (DP-1v2) and the input second doping type of the input negative electrode doped neutral region (DN-1v2) are selected to be different and the absent bottom electrode (210BM). Similarly, all elements in the IDT2 (250) are the same as the IDT2 shown in FIG. 3B except the output first doping type of the output positive electrode doped neutral region (DP-1'v2) and the output second doping type of the output negative electrode doped neutral region (DN-1'v2) are selected to be opposite and the absent bottom electrode (210BM). Due to the doping type difference, the biasing arrangement of the IDT1 and IDT2 are different from that for IDTs having the same doping type shown in FIGS. 3A and 3B.

In FIG. 3C, a first digital to analog converter DAC1 (270) converts a first digital signal (275) to a first input DC biasing voltage $V_{DC}$ which is applied between the input positive electrode finger (220P-1) and the input negative electrode finger (220N-1) through integrated input thin film bias resistors (RP-1, RN-1). Due to the different doping type of the input positive and negative electrode doped neutral regions, the input positive electrode finger (220P-1) is connected to the negative output terminal of the DAC1 through (RP-1) and the input negative electrode finger (220N-1) is connected to the positive output terminal of the DAC1 through (RN-1).

In FIG. 3C, the first input DC biasing voltage $V_{DC}$ could be positive or negative in polarity. The value and the polarity of $V_{DC}$ is regulated and adjusted by the first digital signal (275) applied to the first digital to analog converter DAC1 (270) to achieve control and adjustment for the thickness (DP-1d2t, DN-1d2t) of the input electrode depletion regions (DP-1d2, DN-1d2), the thickness and width (DP-1v2t, DP-1v2w, DN-1v2t, DN-1v2w) of the input electrode doped neutral regions (DP-1v2, DN-1v2). This in turn regulates and changes the input positive electrode loading mass (the sum of mass of (DP-1v2) and mass of (220P-1)) and the input negative electrode loading mass (the sum of mass of (DN-1v2) and mass of (220N-1)) in IDT1 to achieve a mass loading frequency difference $\Delta f_{ML}$ (from the basic frequency value $f_o$) for the surface acoustic waves (240) to be excited. It also adjusts and changes the metallization ratio associate with the input positive electrode doped neutral region and the input negative electrode doped neutral region to achieve a metallization ratio frequency difference $\Delta f_{MR}$.

In FIG. 3D, a second digital to analog converter DAC2 (270') converts a second digital signal (275') to a first output DC biasing voltage $V_{DC'}$ which is applied between the output positive electrode finger (250P-1) and the output negative electrode finger (250N-1) through integrated output thin film bias resistors (RP-1', RN-1'). Due to the different doping type of the output positive and negative electrode doped neutral regions, the output positive electrode finger (250P-1) is connected to the negative output terminal of the DAC2 (270') through (RP-1') and the output negative electrode finger (250N-1) is connected to the positive output terminal of the DAC2 (270') through (RN-1').

In FIG. 3D, the first output DC biasing voltage $V_{DC'}$ could be positive or negative in polarity. The value and the polarity of $V_{DC'}$ is regulated and adjusted by the second digital signal (275') applied to the DAC2 (270') to achieve control and adjustment for the thickness (DP-1'd2t, DN-1'd2t) of the output electrode depletion regions (DP-1'd2, DN-1'd2), the thickness and width (DP-1'v2t, DP-1'v2w, DN-1'v2t, DN-1'v2w) of the output electrode doped neutral regions (DP-1'v2, DN-1'v2). This in turn regulates and changes the output positive electrode loading mass (the sum of mass of (DP-1'v2) and mass of (250P-1)) and the output negative electrode loading mass (the sum of mass of (DN-1'v2) and mass of (250N-1)) in IDT2 to achieve a mass loading frequency difference $\Delta f_{ML}$ (from the basic frequency value $f_o$) for the surface acoustic waves (240) to be received. It also adjusts and changes the metallization ratio associate with the input positive electrode doped neutral region and the input negative electrode doped neutral region to achieve a metallization ratio frequency difference $\Delta f_{MR}$.

It should be pointed out that in FIGS. 3C and 3D, the first digital to analog converter DAC1 (270) and the second digital to analog converter DAC2 (270') can be replaced with a single digital to analog converter, which converts the digital signals into a DC biasing voltage $V_{DC}$ to achieve frequency tuning in both IDT1 and IDT2.

IDTs with Elevated Electrode Doped Regions of the Same Doping Type:

In order to increase the mass loading effects ($\Delta f_{ML}$) and decrease the metallization ratio effects ($\Delta f_{MR}$), SAW structures with elevated electrode doped regions, as shown in FIGS. 4A-4D are provided in this invention.

Figure 4A:
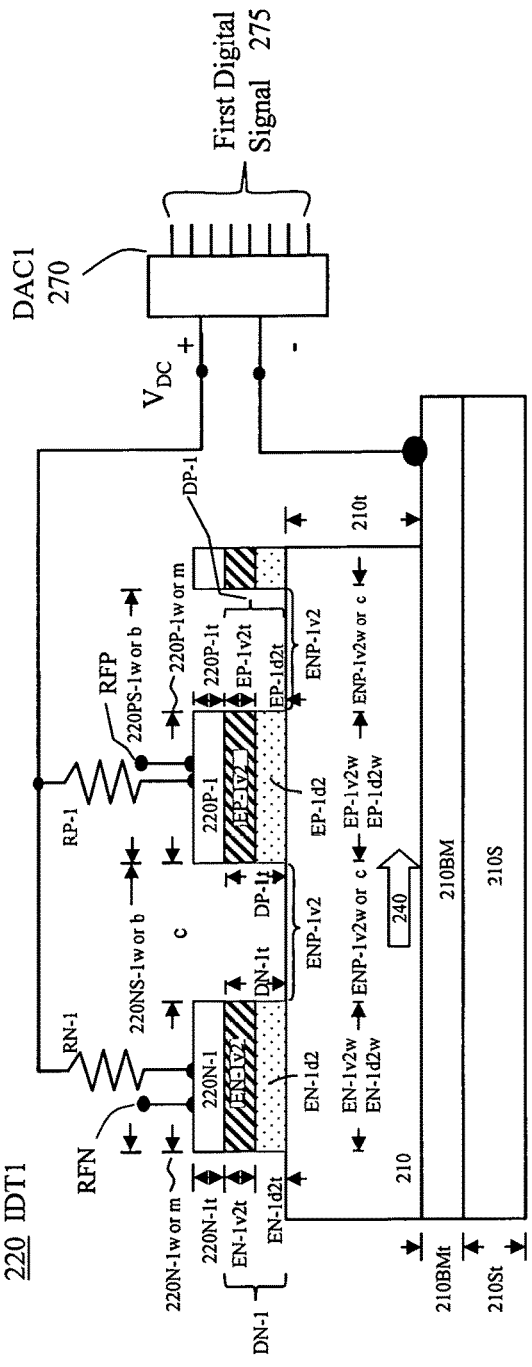
FIG. 4A is a schematic cross-sectional view taken along line A-A' in the tunable SAW filter (200a), showing a part of the IDT1 with elevated input positive and negative electrode doped neutral regions of the same doping type.
Figure 4B:
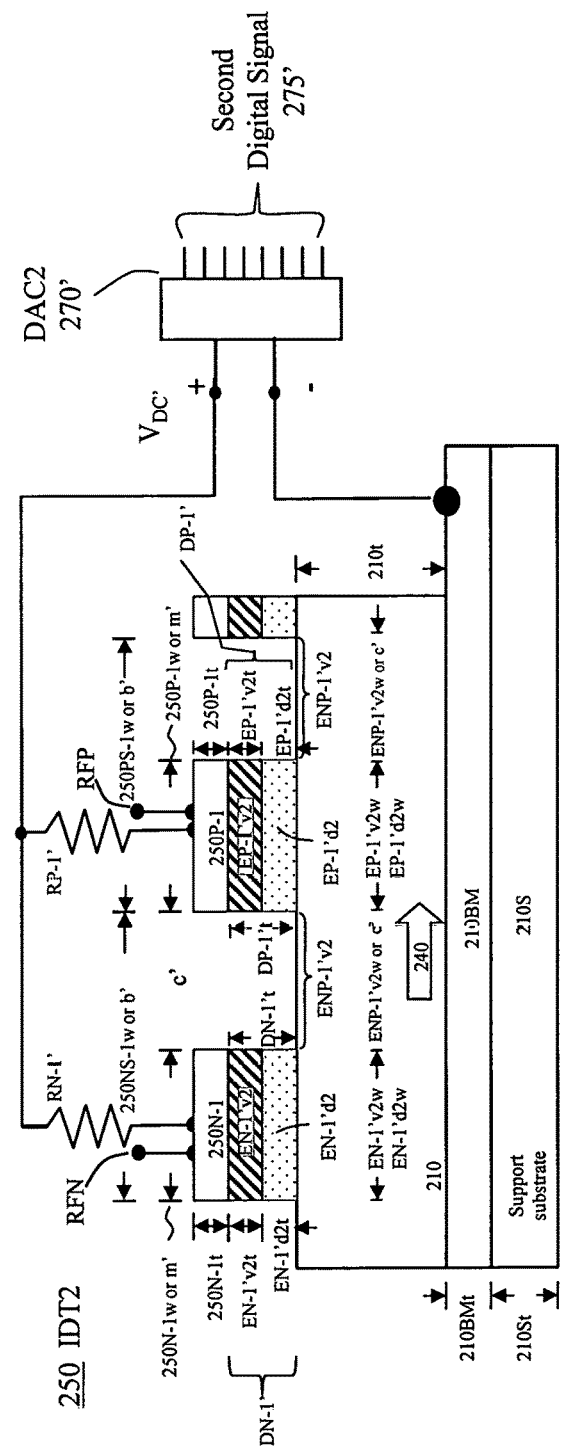
FIG. 4B is a schematic cross-sectional view taken along line B-B' in the tunable SAW filter (200a), showing a part of the IDT2 with elevated output positive and negative electrode doped neutral regions of the same doping type.

A schematic cross sectional view of the IDT1 (220) and the IDT2 (250), taken along lines A-A' and B-B' respectively in the SAW filter (200a) shown in FIG. 2A, are shown in FIGS. 4A and 4B for IDTs with elevated input positive/negative electrode doped regions and elevated output positive/negative electrode doped regions, wherein the doping type of the positive electrode doped regions and the negative electrode doped regions are selected to be the same.

FIG. 4A is a schematic cross-sectional view of a part of IDT1 (220) in a tunable and adjustable SAW filter similar to the IDT1 shown in FIG. 2A. An elevated input positive electrode doped region (DP-1) and an elevated input negative electrode doped region (DN-1) are deposited on a top surface of the first piezoelectric layer (210) of a thickness (210t) which is on a bottom electrode layer (210BM) of a thickness (210BMt) and a support substrate (210S) of a thickness (210St).

The elevated input positive electrode doped region (DP-1) of a thickness (DP-1t) consists of two parts: an elevated input positive electrode doped neutral region (EP-1v2) of a thickness (EP-1v2t) and a width (EP-1v2w) and an elevated input positive electrode depletion region (EP-1d2) of a thickness (EP-1d2t) and a width (EP-1d2w). The elevated input negative electrode doped region (DN-1) of a thickness (DN-1t) also has two parts: an elevated input negative electrode doped neutral region (EN-1v2) of a thickness (EN-1v2t) and a width (EN-1v2w); and an elevated input negative electrode depletion region (EN-1d2) of a thickness (EN-1d2t) and a width (EN-1d2w). The elevated input positive electrode doped neutral region (EP-1v2) has an input first doping type and the elevated input negative electrode doped neutral region (EN-1v2) has an input second doping type which is the same as the input first doping type.

An input positive electrode finger (220P-1) with an input positive electrode finger width (220P-1w or m) which is substantially the same as (EP-1v2w), and an input positive electrode finger thickness (220P-1t) is deposited on top of and is aligned to the elevated input positive electrode doped neutral region (EP-1v2). An input negative electrode finger (220N-1) with an input negative electrode finger width (220N-1w or m) which is substantially the same as the elevated input negative electrode doped region width (EN-1v2w), and an input negative electrode finger thickness (220N-1t) is deposited on top of and is aligned to the elevated input negative electrode doped neutral region (EN-1v2). The input positive electrode finger (220P-1) makes an ohmic contact to the elevated input positive electrode doped neutral region (EP-1v2) and the input negative electrode finger (220N-1) makes an ohmic contact to the elevated input negative electrode doped neutral region (EN-1v2). Regions (EP-1v2, EN-1v2, EP-1d2, EN-1d2) form an elevated electrode doped region structure having an input electrode spacing region (ENP-1v2) with an input electrode spacing region width (ENP-1v2w, or c). A pitch (220NS-1w, 220PS-1w or b) is defined as the sum of the input positive electrode finger width (220P-1w or m) and the input electrode spacing region width (ENP-1v2w or c) which is also equal to the sum of the input negative electrode finger width (220N-1w or m) and the input electrode spacing region width (ENP-1v2w or c): or b=m+c. The wavelength of the surface acoustic waves (240) to be excited is substantially equal to two times of the pitch value: 2×(220NS-1w)=2b=2 (m+c). RF signals are applied through a positive RF contact (RFP) and a negative RF contact (RFN). The integrated input thin film bias resistors (RP-1, RN-1) isolate the RF signals from the DC bias circuit.

In FIG. 4A, (EP-1d2w) is selected to be substantially the same as (EN-1d2w) in magnitude. Furthermore, widths (EP-1d2w) and (EN-1d2w) are substantially the same as widths (EP-1v2w) and (EN-1v2w). Due to the presence of the input electrode positive/negative depletion regions (EP-1d2, EN-1d2), the elevated input positive/negative electrode doped neutral regions (EP-1v2, EN-1v2) have a reduced thickness (EP1v2t, EN-1v2t) as compared with the thickness (DP-1t, DN-1t) of the elevated input positive/negative electrode doped regions (DP-1, DN-1).

It should be emphasized that the input first doping type of the elevated input positive electrode doped neutral region (EP-1v2) and the input second doping type of the elevated input negative electrode doped neutral region (EN-1v2) in FIG. 4A are selected to be the same (either p-type or n-type). The first doping concentration of the elevated input positive electrode doped neutral region (EP-1v2) is also selected to be substantially the same as the second doping concentration of the elevated input negative electrode doped neutral region (EN-1v2). The first and the second doping concentrations are preferably to be controlled in the range of $10^{13}$-$10^{20}$ cm$^{-3}$, depending on the operation frequency and tuning rage required. The input positive electrode finger (220P-1) makes an ohmic contact to the input positive electrode doped neutral region (EP-1v2) and the input negative electrode finger (220N-1) makes an ohmic contact to the input negative electrode doped neutral region (EN-1v2). In order to facilitate ohmic contacts, it is preferable to have a heavily doped surface layer on the elevated input positive/negative electrode doped regions. Thicknesses of the heavily doped surface layers should be kept small (in the order of 20 nm or less).

A first digital to analog converter DAC1 (270) converts a first digital signal (275) to a first input DC biasing voltage $V_{DC}$. Due to the same doping type of the elevated input positive electrode doped neutral region (EP-1v2) and the elevated input negative electrode doped neutral region (EN-1v2), the input electrode fingers (220P-1) and (220N-1) are connected together through integrated input thin film bias resistors (RP-1, RN-1) to a negative output terminal of the DAC1 (270), whereas a bottom electrode layer (210BM) of a thickness (210BMt) is connected to a positive output terminal of the DAC1 (270), so that a first input DC biasing voltage $V_{DC}$ is applied between the input electrode fingers (220P-1, 220N-1) and the bottom electrode layer (210BM). Although the doping types and the biasing arrangement for IDT1 in FIG. 4A are different from the IDT1 shown in FIG. 2A, the elements in FIG. 4A are marked the same as the IDT1 in FIG. 2A for convenience.

In FIG. 4A, the elevated input positive and negative electrode doped neutral regions (EP-1v2, EN-1v2) are electrically conducting. (EP-1v2) forms a part of mass loading together with the input positive electrode finger (220P-1) and (EN-1v2) forms the other part of mass loading together with the input negative electrode finger (220N-1). The first digital signal (275) to the first DAC1 provides and adjust a first input DC biasing voltage $V_{DC}$ which is applied to achieve controlling and varying the mass loading associated with the input electrode fingers (220P-1, 220N-1) to achieve a mass loading frequency difference $\Delta f_{ML}$ (from $f_o$) for the surface acoustic waves (240) to be excited. The mass loading variation is achieved through changes in the thickness (EP-1d2t, EN-1d2t) of the input positive and negative electrode depletion region (EP-1d2, EN-1d2) and hence the thickness (EP-1v2t, EN-1v2t) of the input positive and negative electrode doped neutral regions (EP-1v2, EN-1v2). The first input DC basing voltage $V_{DC}$ could be positive or negative in polarity but with a small magnitude, provided that it can control and vary the thickness of the input positive/negative electrode depletion regions to achieve frequency tuning for the surface acoustic waves to be excited in the IDT1.

FIG. 4B shows a schematic cross-sectional view of a part of IDT2 (250) in a tunable and adjustable SAW filter (200a). An elevated output positive electrode doped region (DP-1') and an elevated output negative electrode doped region (DN-1') are deposited on a top surface of the first piezoelectric layer (210) which is on a bottom electrode layer (210BM) and a support substrate (210S).

The elevated output positive electrode doped region (DP-1') of a thickness (DP-1't) consists of two parts: an elevated output positive electrode doped neutral region (EP-1'v2) of a thickness (EP-1'v2t) and a width (EP-1'v2w); and an elevated output positive electrode depletion region (EP-1'd2) of a thickness (EP-1'd2t) and a width (EP-1'd2w). The elevated output negative electrode doped region (DN-1') of a thickness (DN-1't) also has two parts: an elevated output negative electrode doped neutral region (EN-1'v2) of a thickness (EN-1'v2t) and a width (EN-1'v2w); and an elevated output negative electrode depletion region (EN-1'd2) of a thickness (EN-1'd2t) and a width (EN-1'd2w). The elevated output positive electrode doped neutral region (EP-1'v2) has an output first doping type and the elevated output negative electrode doped neutral region (EN-1'v2) has an output second doping type. It should be emphasized that in this structure, the output first doping type of the elevated output positive electrode doped neutral region (EP-1'v2) and the output second doping type of the elevated output negative electrode doped neutral region (EN-1'v2) are selected to be the same. The first doping concentration of the elevated output positive electrode doped neutral region (EP-1'v2) is also selected to be substantially the same as the second doping concentration of the elevated output negative electrode doped neutral region (EN-1'v2). The first and the second doping concentrations are preferably to be controlled in the range of $10^{13}$-$10^{20}$ cm$^{-3}$, depending on the operation frequency and tuning rage required.

The output positive electrode finger (250P-1) makes an ohmic contact to the output positive electrode doped neutral region (EP-1'v2) and the output negative electrode finger (250N-1) makes an ohmic contact to the output negative electrode doped neutral region (EN-1'v2). In order to facilitate ohmic contacts, it is preferable to have a heavily doped surface layer on the elevated output positive/negative electrode doped regions. Thicknesses of the heavily doped surface layers should be kept small (in the order of 20 nm or less).

An output positive electrode finger (250P-1) with an output positive electrode finger width (250P-1w or m') which is substantially the same as (EP-1'v2w), and an output positive electrode finger thickness (250P-1t) is deposited on top of and is aligned to the elevated output positive electrode doped neutral region (EP-1'v2). An output negative electrode finger (250N-1) with an output negative electrode finger width (250N-1w or m') which is substantially the same as the elevated output negative electrode doped region width (EN-1'v2w), and an output negative electrode finger thickness (250N-1t) is deposited on top of and is aligned to the elevated output negative electrode doped neutral region (EN-1'v2). The output positive electrode finger (250P-1) makes an ohmic contact to the elevated output positive electrode doped neutral region (EP-1'v2) and the output negative electrode finger (250N-1) makes an ohmic contact to the elevated output negative electrode doped neutral region (EN-1'v2). Regions (EP-1'v2, EN-1'v2, EP-1'd2, EN-1'd2) form an elevated electrode doped region structure having an output electrode spacing region (ENP-1'v2) with an output electrode spacing region width (ENP-1'v2w or c'). A pitch (250NS-1w, 250PS-1w or b') is defined as the sum of the output positive electrode finger width (250P-1w or m') and the output electrode spacing region width (ENP-1'v2w or c') which is also equal to the sum of the output negative electrode finger width (250N-1w or m') and the output electrode spacing region width (ENP-1'v2w or c'): or b'=m'+c'. The wavelength of the surface acoustic waves (240) to be received is substantially equal to two times of the pitch value: 2×(250NS-1w)=2b'=2(m'+c'). RF signals are received between a positive RF contact (RFP) and a negative RF contact (RFN). The integrated input thin film bias resistors (RP-1', RN-1') isolate the RF signals from the DC bias circuit.

Due to the same doping type of the elevated output positive and negative electrode doped neutral regions, the output electrode fingers (250P-1) and (250N-1) are connected together to the negative output terminal of the second digital to analog converter DAC2 (270') through integrated input thin film bias resistors (RP-1', RN-1'), whereas the bottom electrode layer (210BM) of a thickness (210BMt) is connected to the positive output terminal of the DAC2 (270'), so that a first output DC biasing voltage $V_{DC'}$ is applied between the output electrode fingers (250P-1, 250N-1) and the bottom electrode layer (210BM). Although the doping types and the biasing arrangement for IDT2 in FIG. 4B are different from IDT2 (250) shown in FIG. 2A, the elements in FIG. 4B are marked the same way as the IDT2 in FIG. 2A for convenience.

In FIG. 4B, (EP-1'd2w) is selected to be substantially the same as (EN-1'd2w) in magnitude. Furthermore, widths (EP-1'd2w) and (EN-1'd2w) are substantially the same as widths (EP-1'v2w) and (EN-1'v2w). Due to the presence of the output electrode positive/negative depletion regions (EP-1'd2, EN-1'd2), the elevated output positive/negative electrode doped neutral regions (EP-1'v2, EN-1'v2) have a smaller thickness (EP1'v2t, EN-1'v2t) as compared with the thickness (DP-1't, DN-1't) of the elevated input positive/negative electrode doped regions (DP-1', DN-1').

In FIG. 4B, the elevated output positive and negative electrode doped neutral regions (EP-1'v2, EN-1'v2) are electrically conducting. (EP-1'v2) forms a part of mass loading together with the output positive electrode finger (250P-1) and (EN-1'v2) forms the other part of mass loading together with the output negative electrode finger (250N-1). The DAC2 provides and adjust a first output DC voltage $V_{DC'}$, which could be positive or negative in polarity. The value and the polarity of the $V_{DC'}$ is regulated and adjusted by the second digital signal (275') supplied to the DAC2 (270') in order to achieve control and adjustment for the thickness (EP-1'd2t, EN-1'd2t) of the output positive/negative electrode depletion regions (EP-1'd2, EN-1'd2) and the thickness (EP-1'v2t, EN-1'v2t) of the output positive/negative electrode doped neutral regions (EP-1'v2, EN-1'v2). This in turn regulates and changes the output positive electrode loading mass (the sum of mass of (EP-1'v2) and mass of (250P-1)) and the output negative electrode loading mass (the sum of mass of (EN-1'v2) and mass of (250N-1)) in IDT2 to achieve a mass loading frequency difference $\Delta f_{ML}$ (from $f_o$) for the surface acoustic waves (240) to be received.

It should be pointed out that in FIGS. 4A and 4B, the first digital to analog converter DAC1 (270) and the second digital to analog converter DAC2 (270') can be replaced with a single digital to analog converter, which converts the digital signals into a DC biasing voltage $V_{DC}$ to achieve frequency tuning in both IDT1 and IDT2.

Figure 4C:
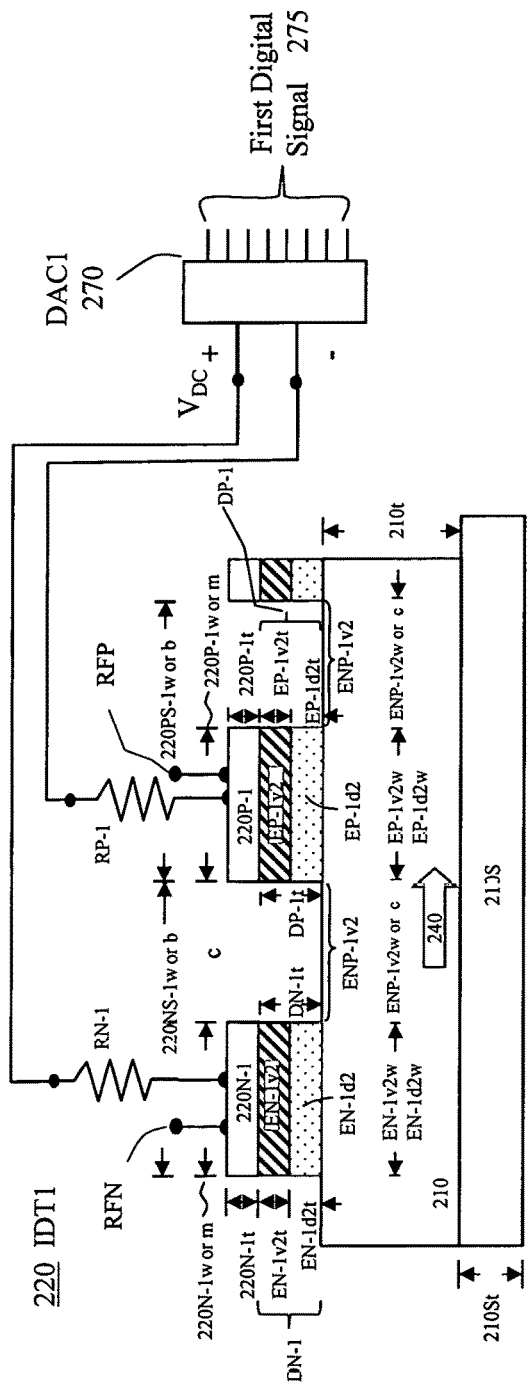
FIG. 4C is a schematic cross-sectional view taken along line A-A' in the tunable SAW filter (200a), showing a part of the IDT1 with elevated input positive and negative electrode doped neutral regions of different doping types.
Figure 4D:
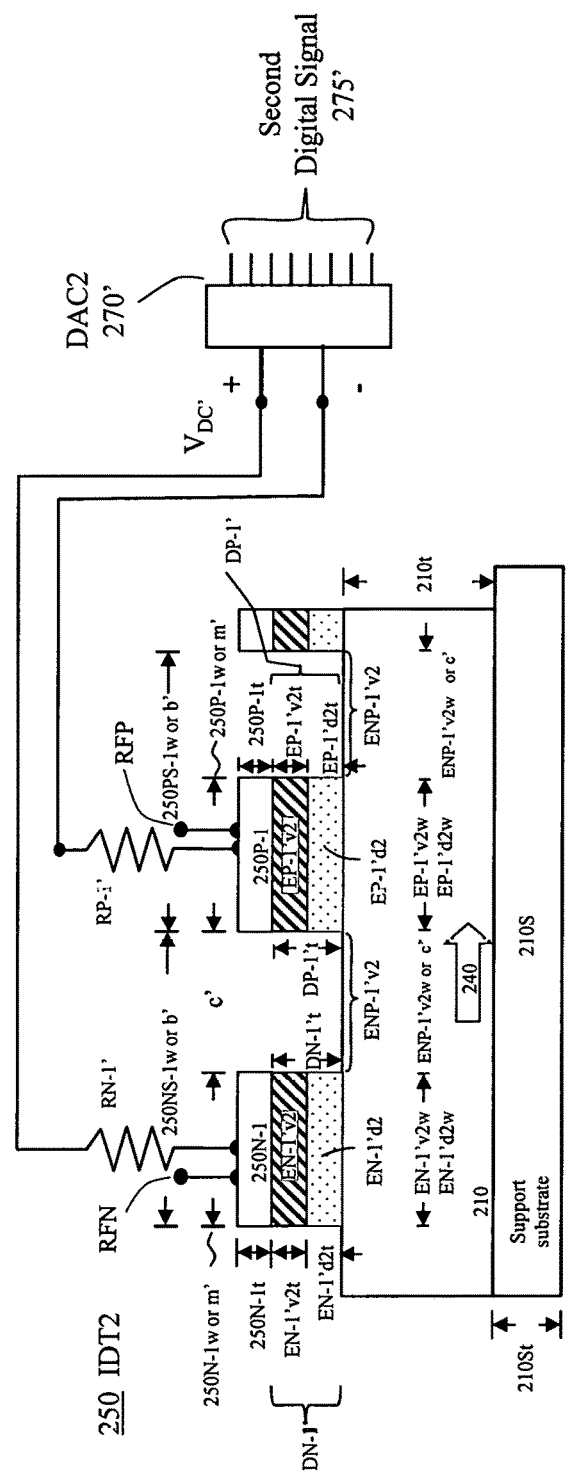
FIG. 4D is a schematic cross-sectional view taken along line B-B' in the tunable SAW filter (200a), showing a part of the IDT2 with elevated output positive and negative electrode doped neutral regions of different doping types.

IDTs with Elevated Electrode Doped Regions of Opposite Doping Types:

FIGS. 4C and 4D show a part of the IDT1 (220) and a part of the IDT2 (250) with elevated input electrode doped regions, taken along the line A-A' and line B-B' in (200a, FIG. 2A) respectively. In this IDT1 (220), all elements are the same as the IDT1 shown in FIG. 4A, except the input first doping type of the elevated input positive electrode doped neutral region (EP-1v2) and the input second doping type of the elevated input negative electrode doped neutral region (EN-1v2) are selected to be different and the absent bottom electrode (210BM). Similarly, all elements in the IDT2 (250) are the same as the IDT2 shown in FIG. 4B except the output first doping type of the elevated output positive electrode doped neutral region (EP-1'v2) and the output second doping type of the elevated output negative electrode doped neutral region (EN-1'v2) are selected to be opposite and the absent bottom electrode (210BM). Due to the doping type difference, the biasing arrangements for the IDT1 and IDT2 are different from those for IDT1 and IDT2 shown in FIGS. 4A and 4B.

In FIG. 4C, a first digital to analog converter DAC1 (270) converts a first digital signal (275) to a first input DC biasing voltage $V_{DC}$ which is applied between the input positive electrode finger (220P-1) and the input negative electrode finger (220N-1) through integrated input thin film bias resistors (RP-1, RN-1). Due to the different doping type of the elevated input positive and negative electrode doped neutral regions, the input positive electrode finger (220P-1) is connected to the negative output terminal of the DAC1 (270) through (RP-1) and the input negative electrode finger (220N-1) is connected to the positive output terminal of the DAC1 through (RN-1).

In FIG. 4C, the first input DC biasing voltage $V_{DC}$ could be positive or negative in polarity. The value and the polarity of $V_{DC}$ is regulated and adjusted by the first digital signal (275) applied to the DAC1 (270) to achieve control and adjustment for the thickness (EP-1d2t, EN-1d2t) of the input electrode depletion regions (EP-1d2, EN-1d2), the thickness (EP-1v2t, EN-1v2t) of the input electrode doped neutral regions (EP-1v2, EN-1v2). This in turn regulates and changes the input positive electrode loading mass (the sum of mass of (EP-1v2) and mass of (220P-1)) and the input negative electrode loading mass (the sum of mass of (EN-1v2) and mass of (220N-1)) in IDT1 to achieve a mass loading frequency difference $\Delta f_{ML}$ (from $f_o$) for the surface acoustic waves (240) to be excited.

In FIG. 4D, a second digital to analog converter DAC2 (270') converts a second digital signal (275') to a first output DC biasing voltage $V_{DC'}$ which is applied between the output positive electrode finger (250P-1) and the output negative electrode finger (250N-1) through integrated output thin film bias resistors (RP-1', RN-1'). Due to the different doping type of the elevated output positive and negative electrode doped neutral regions, the output positive electrode finger (250P-1) is connected to the negative output terminal of the DAC2 (270') through (RP-1') and the output negative electrode finger (250N-1) is connected to the positive output terminal of the DAC2 (270') through (RN-1').

In FIG. 4D, the first output DC biasing voltage $V_{DC'}$ could be positive or negative in polarity. The value and the polarity of $V_{DC'}$ is regulated and adjusted by the second digital signal (275') applied to the DAC2 (270') to achieve control and adjustment for the thickness (EP-1'd2t, EN-1'd2t) of the output electrode depletion regions (EP-1'd2, EN-1'd2), the thickness (EP-1'v2t, EN-1'v2t) of the output electrode doped neutral regions (EP-1'v2, EN-1'v2). This in turn regulates and changes the output positive electrode loading mass (the sum of mass of (EP-1'v2) and mass of (250P-1)) and the output negative electrode loading mass (the sum of mass of (EN-1'v2) and mass of (250N-1)) in IDT2 to achieve a mass loading frequency difference $\Delta f_{ML}$ (from $f_o$) for the surface acoustic waves (240) to be received.

It should be pointed out that in FIGS. 4C and 4D, the first digital to analog converter DAC1 (270) and the second digital to analog converter DAC2 (270') can be replaced with a single digital to analog converter, which converts the digital signals into a DC biasing voltage $V_{DC}$ to achieve frequency tuning in both IDT1 and IDT2.

Surface Acoustic Wave Reflectors

Figure 5:
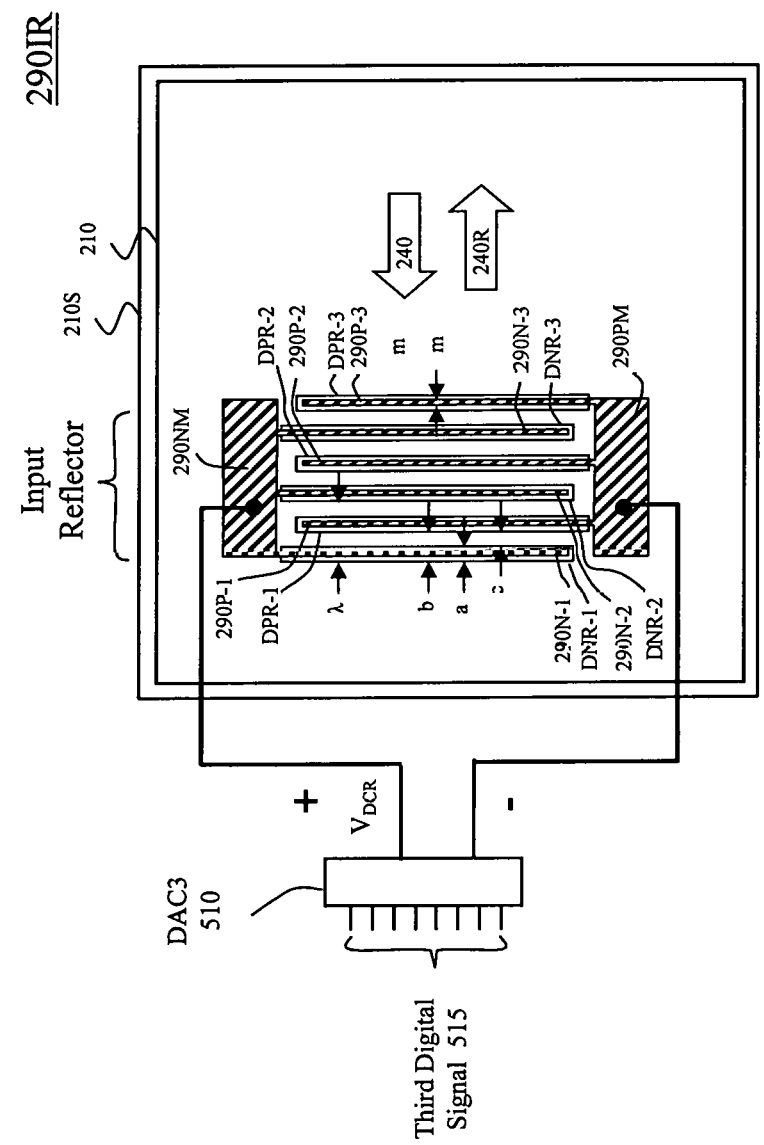
FIG. 5 is a schematic top view showing a tunable input SAW reflector 2901R having input electrode pads, input electrode fingers, input electrode doped regions.

FIG. 5 shows a schematic top view of a surface acoustic wave (SAW) input reflector (290IR) with tunable frequency, according to this invention. It comprises a first piezoelectric layer (210) on a support substrate (210S); an input positive electrode pad (290PM) and an input negative electrode pad (290NM) which may be advantageously constructed on the first piezoelectric layer (210); a plurality of input positive electrode doped regions (DPR-1, DPR-2, DPR-3) which are doped piezoelectric semiconductor; a plurality of metallic input positive electrode fingers (290P-1, 290P-2, 290P-3) each on one of the input positive electrode doped regions; a plurality of input negative electrode doped regions (DNR-1, DNR-2, DNR-3) which are doped piezoelectric semiconductor; a plurality of metallic input negative electrode fingers (290N-1, 290N-2, 290N-3) each on one of the input negative electrode doped regions. In FIG. 5, the input positive electrode doped regions and the input negative electrode doped regions may be embedded or elevated.

By applying a third digital signal (515) to a third digital to analog converter DAC3 (510) to provide and adjust a DC biasing voltage $V_{DCR}$ to control the mass loading and the metallization ratio (or only the mass loading for input reflector with elevated electrode doped regions) associated with the positive and negative electrodes, the frequency of the surface acoustic waves to be reflected (240R) may be controlled to be the same as the frequency of the surface acoustic waves (240) excited by the input IDT1 (220) and/or to be the same as the frequency of the surface acoustic wave to be received by the output IDT2 (250) in the SAW filters (200a) shown in FIG. 2A. As a result of above tuning, when placed beside the input IDT1 (220), majority of SAW waves (240) are reflected as reflected SAW waves (240R) and any unwanted loss of energy for the SAW wave is reduced. A SAW output reflector with tunable and adjustable frequency for the output inter digital transducer IDT2 may also be constructed with the same structure for the SAW input reflector (290IR) to minimize loss of surface acoustic wave energy for receiving. When placed beside the output inter digital transducer IDT2 (250), any unwanted loss of energy for the surface acoustic wave to be received is reduced.

What is claimed is:

1. A tunable SAW inter digital transducer (IDT) structure for surface acoustic wave devices comprises:
    digital to analog converter (DAC) converts a digital signal to a DC voltage with a value and a polarity for providing a DC biasing voltage to said IDT structure and for tuning a central frequency of said IDT structure;
    a support substrate with a support substrate thickness;
    a first piezoelectric layer with a first piezoelectric layer thickness on said support substrate;
    a plurality of positive electrode doped regions embedded in said first piezoelectric layer, said embedded positive electrode doped regions are piezoelectric semiconductors having a first doping type;
    a plurality of negative electrode doped regions embedded in said first piezoelectric layer, said embedded negative electrode doped regions are piezoelectric semiconductors having a second doping type, wherein each said negative electrode doped region is between two adjacent positive electrode doped regions with a center to center distance between a positive electrode doped region and an adjacent negative electrode doped region controlled to a pitch b;
    a plurality of positive electrode fingers each one on respective of said embedded positive electrode doped regions, said positive electrode fingers are connected to a positive electrode pad;
    a plurality of negative electrode fingers each one on respective of said embedded negative electrode doped regions, said negative electrode fingers are connected to a negative electrode pad; and
    a plurality of integrated thin film bias resistors each with a respective bias resistor resistance value for DC biasing and RF signal isolation,
wherein said DC biasing voltage provided by said DAC is applied to said IDT through said respective integrated thin film bias resistors to control and vary dimensions of respective depletion regions formed in said embedded positive electrode doped regions and embedded negative electrode doped regions so that a loading mass and a metallization ratio associated with each said positive electrode fingers and negative electrode fingers are adjusted to achieve central frequency tuning for surface acoustic waves to be excited or to be received in said IDT, whereas said positive electrode pad and negative electrode pad are connected to an electrical signal source to excite said surface acoustic waves in said IDT or to a signal receiver to receive said surface acoustic waves from said IDT.

2. The tunable SAW IDT structure for surface acoustic wave devices of claim 1, wherein material for said support substrate is selected from a group including: $LiNbO_3$, $LiTaO_3$, PZT, AlN, GaN, AlGaN, ZnO, GaAs, AlAs, AlGaAs, $Al_2O_3$, $BaTiO_3$, quartz and $KNbO_3$, Si, sapphire, quartz, glass and plastic.

3. The tunable SAW IDT structure for surface acoustic wave devices of claim 1, wherein said first piezoelectric layer is selected from a group of piezoelectric materials including: $LiNbO_3$, $LiTaO_3$, ZnO, AlN, GaN, AlGaN, $LiTaO_3$, GaAs, AlGaAs.

4. The tunable SAW IDT structure for surface acoustic wave devices of claim 1, wherein materials of said embedded positive electrode doped regions and embedded negative electrode doped regions are selected from a group including: AlN, GaN, AlGaN, ZnO, GaAs, AlAs, AlGaAs as long as they are piezoelectric, are semiconducting and can be doped to n-type or p-type conduction with a doping concentration in a range of $10^{13}$ to $10^{20}$ $cm^{-3}$ for effective frequency tuning.

5. The tunable SAW IDT structure for surface acoustic wave devices as of claim 1, wherein said first doping type of said embedded positive electrode doped regions is opposite to said second doping type of said embedded negative electrode doped regions and said DC biasing voltage provided by said DAC is applied between said positive electrode pad and said negative electrode pad through said integrated thin film bias resistors.

6. The tunable SAW IDT structure for surface acoustic wave devices of claim 1, wherein said first doping type is the same as said second doping type, further comprising a bottom electrode layer sandwiched between said first piezoelectric layer and said support substrate, said DC biasing voltage provided by said DAC is applied between said positive and negative electrode pads and said bottom electrode layer through said respective integrated thin film bias resistors, materials of said bottom electrode layer are selected from a group including: Ti, Al, W, Pt, Mo, Cr, Pd, Ta, Cu, Cr, Au, Ni, Ag, Ru, Ir, AlN, GaN, AlGaN, ZnO, GaAs, AlAs, AlGaAs and their combinations.

7. The tunable SAW IDT structure for surface acoustic wave devices of claim 1, wherein materials for said positive electrode fingers and negative electrode fingers are selected from a group including: Ti, Al, W, Pt, Mo, Cr, Pd, Ta, Cu, Cr, Au, Ni, Ag, Ru, Ir and their alloys, whereas thicknesses of said positive electrode fingers and negative electrode fingers are selected in a range of 10 to 400 nm, dependent on an operation frequency and a tuning range required.

8. The tunable SAW IDT structure for surface acoustic wave devices of claim 1, wherein materials of said respective integrated thin film bias resistors are selected from a group including: Ni, Cr, Ta, W, Mo, NiCr, $RuO_2$, TaN, ZnO, ZnON, InSnO, InSnON, ZnInO ZnInON, ZnSnO, ZnSnON, $Bi_2Ru_2O_7$, $RuO_2$, $Bi_2Ir_2O_7$, and Si, as long as the resistance value of each of said respective thin film bias resistors is greater than 200Ω.

9. The tunable SAW IDT structure for surface acoustic wave devices of claim 1, further comprising a heavily doped layer on top of said embedded negative electrode doped regions and another heavily doped layer on top of said embedded positive electrode doped regions to reduce contact resistance.

10. The tunable SAW IDT structure for surface acoustic wave devices of claim 1, wherein said tunable SAW IDT structure is a tunable input inter digital transducer for receiving RF signals and producing said surface acoustic waves.

11. The tunable SAW IDT structure for surface acoustic wave devices of claim 1, wherein said tunable SAW IDT structure is a tunable output inter digital transducer for receiving said surface acoustic waves and converting them to RF signals.

12. The tunable SAW IDT structure for surface acoustic wave devices of claim 1, wherein said tunable SAW IDT structure is a tunable reflector for surface acoustic waves.

13. A tunable SAW inter digital transducer (IDT) structure for surface acoustic wave devices comprises:
    digital to analog converter (DAC) converts a digital signal to a DC voltage with a value and a polarity for providing a DC biasing voltage to said IDT structure and for tuning a central frequency of said IDT structure;
    a support substrate with a support substrate thickness;
    a first piezoelectric layer with a first piezoelectric layer thickness;

a plurality of elevated positive electrode doped regions on said first piezoelectric layer, said elevated positive electrode doped regions are piezoelectric semiconductors having a first doping type;

a plurality of elevated negative electrode doped regions on said first piezoelectric layer, said elevated negative electrode doped regions are piezoelectric semiconductors having a second doping type, wherein each said elevated negative electrode doped region is between two adjacent elevated positive electrode doped regions with a center to center distance between an elevated positive electrode doped region and an adjacent elevated negative electrode doped region controlled to a pitch b;

a plurality of positive electrode fingers each one on respective of said elevated positive electrode doped regions, said positive electrode fingers are connected to a positive electrode pad;

a plurality of negative electrode fingers each one on respective of said elevated negative electrode doped regions, said negative electrode fingers are connected to a negative electrode pad; and a plurality of integrated thin film bias resistors each with a respective bias resistor resistance value for DC biasing and RF signal isolation, wherein said DC biasing voltage provided by said DAC is applied to said IDT through said respective integrated thin film bias resistors to control and vary dimensions of respective depletion regions formed in said elevated positive electrode doped regions and elevated negative electrode doped regions so that a loading mass and a metallization ratio associated with each said positive electrode fingers and negative electrode fingers are adjusted to achieve central frequency tuning for surface acoustic waves to be excited or to be received in said IDT, whereas said positive electrode pad and negative electrode pad are connected to an electrical signal source to excite said surface acoustic waves in said IDT or to a signal receiver to receive said surface acoustic waves from said IDT.

14. The tunable SAW IDT structure for surface acoustic wave devices of claim 13, wherein material for said support substrate is selected from a group including: $LiNbO_3$, $LiTaO_3$, PZT, AlN, GaN, AlGaN, ZnO, GaAs, AlAs, AlGaAs, $Al_2O_3$, $BaTiO_3$, quartz and $KNbO_3$, Si, sapphire, quartz, glass, and plastic.

15. The tunable SAW IDT structure for surface acoustic wave devices of claim 13, wherein said first piezoelectric layer is selected from a group of piezoelectric materials including: $LiNbO_3$, $LiTaO_3$, ZnO, AlN, GaN, AlGaN, $LiTaO_3$, GaAs, AlGaAs.

16. The tunable SAW IDT structure for surface acoustic wave devices of claim 13, wherein materials of said elevated positive electrode doped regions and said elevated negative electrode doped regions are selected from a group including: AlN, GaN, AlGaN, ZnO, GaAs, AlAs, AlGaAs, as long as they are piezoelectric and are semiconducting and can be doped to n-type or p-type conduction with a doping concentration in a range of $10^{13}$ to $10^{20}$ $cm^{-3}$ for effective frequency tuning.

17. The tunable SAW IDT structure for surface acoustic wave devices of claim 13, wherein said first doping type of said elevated positive electrode doped regions is opposite to said second doping type of said elevated negative electrode doped regions and said DC biasing voltage provided by said DAC is applied between said positive electrode pad and said negative electrode pad through said respective integrated thin film bias resistors.

18. The tunable SAW IDT structure for surface acoustic wave devices of claim 13, wherein said first doping type is the same as said second doping type, further comprising a bottom electrode layer sandwiched between said first piezoelectric layer and said support substrate, said DC biasing voltage provided by said DAC is applied between said positive and negative electrode pads and said bottom electrode layer through said respective integrated thin film bias resistors, materials of said bottom electrode layer are selected from a group including: Ti, Al, W, Pt, Mo, Cr, Pd, Ta, Cu, Cr, Au, Ni, Ag, Ru, Ir, AlN, GaN, AlGaN, ZnO, GaAs, AlAs, AlGaAs and their combinations.

19. The tunable SAW IDT structure for surface acoustic wave devices of claim 13, wherein materials for said positive electrode fingers and said negative electrode fingers are selected from a group including: Ti, Al, W, Pt, Mo, Cr, Pd, Ta, Cu, Cr, Au, Ni, Ag, Ru, Ir and their alloys, whereas thickness of said positive electrode fingers and said negative electrode fingers is selected to be in a range of 10 to 400 nm, dependent on an operation frequency and a tuning range required.

20. The tunable SAW IDT structure for surface acoustic wave devices of claim 13, wherein materials of said thin film bias resistors are selected from a group including: Ni, Cr, Ta, W, Mo, NiCr, $RuO_2$, TaN, ZnO, ZnON, InSnO, InSnON, ZnInO ZnInON, ZnSnO, ZnSnON, $Bi_2Ru_2O_7$, $RuO_2$, $Bi_2Ir_2O_7$, and Si, as long as the resistance value of each of said respective thin film bias resistors is greater than 200Ω.

21. The tunable SAW IDT structure for surface acoustic wave devices of claim 13, further comprising a heavily doped layer on top of said elevated negative electrode doped regions and another heavily doped layer on top of said elevated positive electrode doped regions to reduce contact resistance.

22. The tunable SAW IDT structure for surface acoustic wave devices of claim 13, wherein said tunable SAW IDT structure is a tunable input inter digital transducer for receiving RF signals and producing said surface acoustic waves.

23. The tunable SAW IDT structure for surface acoustic wave devices of claim 13, wherein said tunable SAW IDT structure is a tunable output inter digital transducer for receiving said surface acoustic waves and converting them to RF signals.

24. The tunable SAW IDT structure for surface acoustic wave devices of claim 13, wherein said tunable SAW IDT structure is a tunable reflector for surface acoustic waves.

* * * * *